(12) United States Patent
Liu et al.

(10) Patent No.: US 10,902,930 B2
(45) Date of Patent: Jan. 26, 2021

(54) SHIFT REGISTER, GATE DRIVING CIRCUIT AND DRIVING METHOD, AND DISPLAY APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Peng Liu, Beijing (CN); Zhen Wang, Beijing (CN); Han Zhang, Beijing (CN); Kai Zhang, Beijing (CN); Yun Qiao, Beijing (CN); Jian Sun, Beijing (CN); Bailing Liu, Beijing (CN); Fei Huang, Beijing (CN); Zhengkui Wang, Beijing (CN); Jianjun Zhang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/489,185

(22) PCT Filed: Oct. 25, 2018

(86) PCT No.: PCT/CN2018/111954
§ 371 (c)(1),
(2) Date: Aug. 27, 2019

(87) PCT Pub. No.: WO2019/109751
PCT Pub. Date: Jun. 13, 2019

(65) Prior Publication Data
US 2020/0005881 A1    Jan. 2, 2020

(30) Foreign Application Priority Data

Dec. 8, 2017 (CN) .......................... 2017 1 1299235

(51) Int. Cl.
*G11C 19/28* (2006.01)
*G09G 3/3266* (2016.01)
*G09G 3/36* (2006.01)

(52) U.S. Cl.
CPC ........... *G11C 19/28* (2013.01); *G09G 3/3266* (2013.01); *G09G 3/3677* (2013.01); *G09G 2310/0286* (2013.01)

(58) Field of Classification Search
CPC ..... G09G 3/3266; G09G 3/3677; G11C 19/28
(Continued)

(56) References Cited

U.S. PATENT DOCUMENTS

| | | | | | |
|---|---|---|---|---|---|
| 5,161,203 | A | * | 11/1992 | Buckley | .................... G06K 9/66 382/157 |
| 2004/0090412 | A1 | * | 5/2004 | Jeon | ...................... G11C 19/184 345/100 |

(Continued)

*Primary Examiner* — Prabodh M Dharia
(74) *Attorney, Agent, or Firm* — McDermott Will & Emery LLP

(57) ABSTRACT

A shift register includes a first input sub-circuit, a pull-up control sub-circuit, and a pull-down control sub-circuit. The first input sub-circuit is configured to transmit a voltage from the first signal terminal to the first node under control of the first voltage terminal. The pull-up control sub-circuit is configured to be in a turn-on or turn-off state under control of the first node. The pull-down control sub-circuit is configured to transmit a voltage from the third voltage terminal to the pull-down node under control of the first node, transmit the voltage from the third voltage terminal to the pull-down node under control of the signal output (Continued)

terminal, and transmit a voltage from the first clock signal terminal to the pull-down node under control of the first clock signal terminal.

18 Claims, 11 Drawing Sheets

(58) Field of Classification Search
USPC .................................. 345/100, 214; 700/83
See application file for complete search history.

(56) References Cited

U.S. PATENT DOCUMENTS

| | | | |
|---|---|---|---|
| 2007/0171115 A1* | 7/2007 | Kim ............... | G09G 3/3677 341/155 |
| 2008/0001904 A1* | 1/2008 | Kim ............... | G09G 3/3677 345/100 |
| 2009/0204239 A1* | 8/2009 | Netzel, Sr. ........ | H05B 45/20 700/83 |
| 2014/0168044 A1* | 6/2014 | Hu ................. | G09G 3/3696 345/90 |
| 2015/0255034 A1* | 9/2015 | Hong ............... | G09G 3/3674 345/214 |
| 2016/0217728 A1* | 7/2016 | In .................. | G09G 3/2096 |
| 2016/0358573 A1* | 12/2016 | Takeuchi ......... | G09G 3/3677 |
| 2016/0372063 A1* | 12/2016 | Li .................. | G09G 3/3677 |
| 2017/0032750 A1* | 2/2017 | Shao ............... | G11C 19/28 |
| 2018/0277043 A1* | 9/2018 | Li .................. | G09G 3/3266 |
| 2020/0051655 A1* | 2/2020 | Dong ............... | G09G 3/3266 |

* cited by examiner

SHIFT REGISTER, GATE DRIVING CIRCUIT AND DRIVING METHOD, AND DISPLAY APPARATUS

CROSS-REFERENCE TO RELATED APPLICATION

This application is a national phase entry under 35 USC 371 of International Patent Application No. PCT/CN2018/111954 filed on Oct. 25, 2018, which claims priority to Chinese Patent Application No. 201711299235.5, filed with the Chinese Patent Office on Dec. 8, 2017, titled "SHIFT REGISTER UNIT, GATE DRIVING CIRCUIT AND DRIVING METHOD, AND DISPLAY DEVICE", which are incorporated herein by reference in their entirety.

TECHNICAL FIELD

The present disclosure relates to the field of display technologies, and in particular, to a shift register, a gate driving circuit and a driving method, and a display device.

BACKGROUND

With a continuous improvement of display technologies, people's requirements for display devices are also increasing. In order to achieve a low cost and a narrow bezel, a gate driver on array (GOA) technique is usually used. A gate driving circuit is integrated on an array substrate of a display panel by using the GOA technique, so that a gate driving integrated circuit (IC) may be omitted.

SUMMARY

Some embodiments of the present disclosure provide a shift register including a first input sub-circuit, a pull-up control sub-circuit and a pull-down control sub-circuit. The first input sub-circuit is coupled to a first signal terminal, a first voltage terminal and a first node, and the first input sub-circuit is configured to transmit a voltage from the first signal terminal to the first node under control of a voltage from the first voltage terminal. The pull-up control sub-circuit is coupled to the first node, a second voltage terminal and a second node, and the pull-up control sub-circuit is configured to be in a turn-on or turn-off state under control of a voltage on the first node and transmit a voltage from the second voltage terminal to the second node when the pull-up control sub-circuit is in the turn-on state. The pull-down control sub-circuit is coupled to the first node, a third voltage terminal, a first clock signal terminal, a signal output terminal and a pull-down node, and the pull-down control sub-circuit is configured to transmit a voltage from the third voltage terminal to the pull-down node under control of a voltage on the first node, transmit the voltage from the third voltage terminal to the pull-down node under control of a voltage from the signal output terminal, and transmit a voltage from the first clock signal terminal to the pull-down node under control of a voltage from the first clock signal terminal. The second node is coupled to a pull-up node.

In some embodiments, the pull-up node is configured to control the signal output terminal of the shift register to output a gate scanning signal, and the pull-down node is configured to stop the signal output terminal from outputting the gate scanning signal.

In some embodiments, the shift register further includes a filter sub-circuit coupled to the second node, the pull-up node and the second voltage terminal. The filter sub-circuit is configured, under control of the voltage from the second voltage terminal, to filter noises in the voltage input via the second node to the filter sub-circuit, and transmit the filtered voltage to the pull-up node.

In some embodiments, the shift register further includes a second input sub-circuit coupled to a second signal terminal, a fourth voltage terminal and the first node. The second input sub-circuit is configured to transmit a voltage from the second signal terminal to the first node under control of a voltage from the fourth voltage terminal.

In some embodiments, the shift register further includes a pull-down sub-circuit and an output sub-circuit. The pull-down sub-circuit is coupled to the pull-down node, the second node, the signal output terminal and the third voltage terminal, and the pull-down sub-circuit is configured to transmit the voltage from the third voltage terminal to the second node and the signal output terminal under control of a voltage on the pull-down node. The output sub-circuit is coupled to the pull-up node, a second clock signal terminal and the signal output terminal, and the output sub-circuit is configured to output a voltage from the second clock signal terminal to the signal output terminal under control of a voltage on the pull-up node.

In some embodiments, the shift register further includes an initialization sub-circuit. The initialization sub-circuit is coupled to a third signal terminal, the second voltage terminal and the pull-down node. The initialization sub-circuit is configured to transmit the voltage from the second voltage terminal to the pull-down node under control of a voltage from the third signal terminal.

In some embodiments, the shift register further includes a residual charge elimination sub-circuit. The residual charge elimination sub-circuit is coupled to a fourth signal terminal, the third voltage terminal, the second node, the pull-down node and the signal output terminal. The residual charge elimination sub-circuit is configured to transmit the voltage from the third voltage terminal to the second node and the pull-down node under control of a voltage from the fourth signal terminal. The residual charge elimination sub-circuit is further configured to transmit the voltage from the fourth signal terminal to the signal output terminal.

In some embodiments, the first input sub-circuit includes a first transistor. A gate of the first transistor is coupled to the first voltage terminal, a first electrode of the first transistor is coupled to the first signal terminal, and a second electrode of the first transistor is coupled to the first node.

In some embodiments, the pull-up control sub-circuit includes a second transistor. A gate of the second transistor is coupled to the first node, a first electrode of the second transistor is coupled to the second voltage terminal, and a second electrode of the second transistor is coupled to the second node.

In some embodiments, the pull-down control sub-circuit includes a third transistor, a fourth transistor and a fifth transistor. A gate of the third transistor is coupled to the first clock signal terminal, a first electrode of the third transistor is coupled to the first clock signal terminal, and a second electrode of the third transistor is coupled to the pull-down node. A gate of the fourth transistor is coupled to the first node, a first electrode of the fourth transistor is coupled to the pull-down node, and a second electrode of the fourth transistor is coupled to the third voltage terminal. A gate of the fifth transistor is coupled to the signal output terminal, a first electrode of the fifth transistor is coupled to the pull-down node, and a second electrode of the fifth transistor is coupled to the third voltage terminal.

In some embodiments, the pull-down control sub-circuit further includes a sixth transistor. A gate of the sixth transistor is coupled to the second voltage terminal, a first electrode of the sixth transistor is coupled to the first clock signal terminal, and a second electrode of the sixth transistor is coupled to the gate of the third transistor.

In some embodiments, the pull-down control sub-circuit further includes a first capacitor. A first electrode of the first capacitor is coupled to the pull-down node, and a second electrode of the first capacitor is coupled to the third voltage terminal.

In some embodiments, in a case where the shift register further includes the filter sub-circuit, the filter sub-circuit includes a seventh transistor. A gate of the seventh transistor is coupled to the second voltage terminal, a first electrode of the seventh transistor is coupled to the second node, and a second electrode of the seventh transistor is coupled to the pull-up node.

In some embodiments, in a case where the shift register further includes the second input sub-circuit, the second input sub-circuit includes an eighth transistor. A gate of the eighth transistor is coupled to the fourth voltage terminal, a first electrode the eighth transistor is coupled to the first node, and a second electrode the eighth transistor is coupled to the second signal terminal.

In some embodiments, the pull-down sub-circuit includes a ninth transistor and a tenth transistor, and the output sub-circuit includes an eleventh transistor and a second capacitor. A gate of the ninth transistor is coupled to the pull-down node, a first electrode of the ninth transistor is coupled to the second node, and a second electrode of the ninth transistor is coupled to the third voltage terminal. A gate of the tenth transistor is coupled to the pull-down node, a first electrode of the tenth transistor is coupled to the signal output terminal, and a second electrode of the tenth transistor is coupled to the third voltage terminal. A first electrode of the second capacitor is coupled to the pull-up node, and a second electrode of the second capacitor is coupled to the signal output terminal. A gate of the eleventh transistor is coupled to the pull-up node, a first electrode of the eleventh transistor is coupled to the second clock signal terminal, and a second electrode of the eleventh transistor is coupled to the signal output terminal.

In some embodiments, in a case where the shift register further includes the initialization sub-circuit, the initialization sub-circuit includes a twelfth transistor. A gate of the twelfth transistor is coupled to the third signal terminal, a first electrode of the twelfth transistor is coupled to the pull-down node, and a second electrode of the twelfth transistor is coupled to the second voltage terminal.

In some embodiments, in a case where the shift register further includes the residual charge elimination sub-circuit, the residual charge elimination sub-circuit includes a thirteenth transistor, a fourteenth transistor and a fifteenth transistor. A gate of the thirteenth transistor is coupled to the fourth signal terminal, a first electrode of the thirteenth transistor is coupled to the pull-down node, and a second electrode of the thirteenth transistor is coupled to the third voltage terminal. A gate of the fourteenth transistor is coupled to the fourth signal terminal, a first electrode of the fourteenth transistor is coupled to the signal output terminal, and a second electrode of the fourteenth transistor is coupled to the fourth signal terminal. A gate of the fifteenth transistor is coupled to the fourth signal terminal, a first electrode of the fifteenth transistor is coupled to the second node, and a second electrode of the fifteenth transistor is coupled to the third voltage terminal.

Some embodiments of the present disclosure provide a gate driving circuit including at least two stages of shift registers coupled in cascade according to a first aspect. A first signal terminal of a first-stage shift register is coupled to a start signal terminal. A first input terminal of each stage of shift register except for the first-stage shift register is coupled to a signal output terminal of a shift register in a previous stage.

In some embodiments, in a case where each stage of shift register further includes a second input sub-circuit, a second signal terminal of each stage of shift register except for a last-stage shift register is coupled to a signal output terminal of a shift register in a next stage, and a second signal terminal of the last-stage shift register is coupled to the start signal terminal or a reset signal terminal.

In some embodiments, in a case where each stage of shift register includes an output sub-circuit, first clock signal terminal(s) in odd-numbered stage(s) of shift register(s) are coupled to a first clock signal line, and second clock signal terminal(s) in the odd-numbered stage(s) of shift register(s) are coupled to a second clock signal line. First clock signal terminal(s) in even-numbered stage(s) of shift register(s) are coupled to the second clock signal line, and second clock signal terminal(s) in the even-numbered stage(s) of shift register(s) are coupled to the first clock signal line.

Some embodiments of the present disclosure further provide a display device including the gate driving circuit according to a second aspect.

Some embodiments of the present disclosure further provide a driving method of the above shift register. The method includes: in an input period: transmitting, by the first input sub-circuit, a voltage from the first signal terminal to a first node under control of a voltage from the first voltage terminal to control the pull-up control sub-circuit to be turned on by using the voltage on the first node to transmit a voltage from the second voltage terminal to the pull-up node via the second node; and transmitting, by the pull-down control sub-circuit, a voltage from the third voltage terminal to the pull-down node under control of the voltage on the first node; in an output period: controlling the pull-up control sub-circuit to be in a turn-off state under control of a voltage on the first node; and transmitting, by the pull-down control sub-circuit, the voltage from the third voltage terminal to the pull-down node under control of a voltage from the signal output terminal; and in a pull-down period: controlling the pull-up control sub-circuit to be in the turn-off state under control of a voltage on the first node; and transmitting, by the pull-down control sub-circuit, a clock signal from the first clock signal terminal to the pull-down node under control of the first clock signal terminal.

In some embodiments, in a case where the shift register includes a filter sub-circuit, a pull-down sub-circuit and an output sub-circuit, in the input period, the method further includes: filtering, by the filter sub-circuit, filtering noises in a voltage from the second node, and transmitting, by the filter sub-circuit, the filtered voltage to the pull-up node; in the output period, the method further includes: transmitting, by the output sub-circuit, a clock signal from a second clock signal terminal to the signal output terminal under control of a voltage on the pull-up node to output a gate scanning signal via the signal output terminal; and in the pull-down period, the method further includes: transmitting, by the pull-down sub-circuit, the voltage from the third voltage terminal to the second node under control of a voltage on the pull-down node; filtering, by the filter sub-circuit, noises in the voltage from the second node, and transmitting, by the filter sub-circuit, the filtered voltage to the pull-up node to control the output sub-circuit to be turned off; and outputting, by the pull-down sub-circuit, the voltage from the third voltage terminal to the signal output terminal.

In some embodiments, the shift register unit includes an initialization sub-circuit and a residual charge elimination sub-circuit. The method further includes: in an initialization period: transmitting, by the initialization sub-circuit, the voltage from the second voltage terminal to the pull-down node under control of a signal from a third signal terminal; and transmitting, by the pull-down sub-circuit, the voltage from the third voltage terminal to the second node under control of a voltage on the pull-down node; filtering, by the filter sub-circuit, noises in the voltage from the second node, and transmitting, by the filter sub-circuit, the filtered voltage to the pull-up node; and outputting, by the pull-down sub-circuit, the voltage from the third voltage terminal to the signal output terminal; and in a residual charge elimination period: transmitting, by the residual charge elimination sub-circuit, the voltage from the third voltage terminal to the pull-down node and the second node under control of a signal from a fourth signal terminal; filtering, by the filter sub-circuit, noises in the voltage from the second node, and transmitting, by the filter sub-circuit, the filtered voltage, to the pull-up node; and outputting, by the residual charge elimination sub-circuit, a voltage from the fourth signal terminal to the signal output terminal.

Some embodiments of the present disclosure provide a driving method of the above shift register. In a case where the shift register includes a second input sub-circuit, the driving method includes: in an input period: transmitting, by the second input sub-circuit, a voltage input via a second signal terminal to the first node under control of a voltage from a fourth voltage terminal to control the pull-up control sub-circuit to be turned on by using the voltage on the first node to transmit the voltage from the second voltage terminal to the pull-up node via the second node; and transmitting, by the pull-down control sub-circuit, the voltage from the third voltage terminal to the pull-down node under control of the voltage on the first node; and in an output period: controlling the pull-up control sub-circuit to be in the turn-off state under control of a voltage on the first node; and transmitting, by the pull-down control sub-circuit, the voltage from the third voltage terminal to the pull-down node under control of a voltage from the signal output terminal; and in a pull-down period: controlling the pull-up control sub-circuit to be in the turn-off state under control of a voltage on the first node; and transmitting, by the pull-down control sub-circuit, a clock signal from the first clock signal terminal to the pull-down node under control of the first clock signal terminal.

BRIEF DESCRIPTION OF THE DRAWINGS

In order to describe technical solutions in embodiments of the present disclosure or in the related art more clearly, the accompanying drawings to be used in the description of embodiments or the related art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In a gate driving circuit in the related art, a reset signal terminal of a shift register in a present stage is coupled to a signal output terminal of a shift register in a next stage, which causes the shift register in the present stage to rely on signals provided by the shift register in the next stage to complete work in a pull-down period. In a case of an abnormal output of the shift register in the next stage, the shift register in the present stage may not complete the work in the pull-down period, thereby causing an output of the gate driving circuit to be abnormal.

Figure 1:
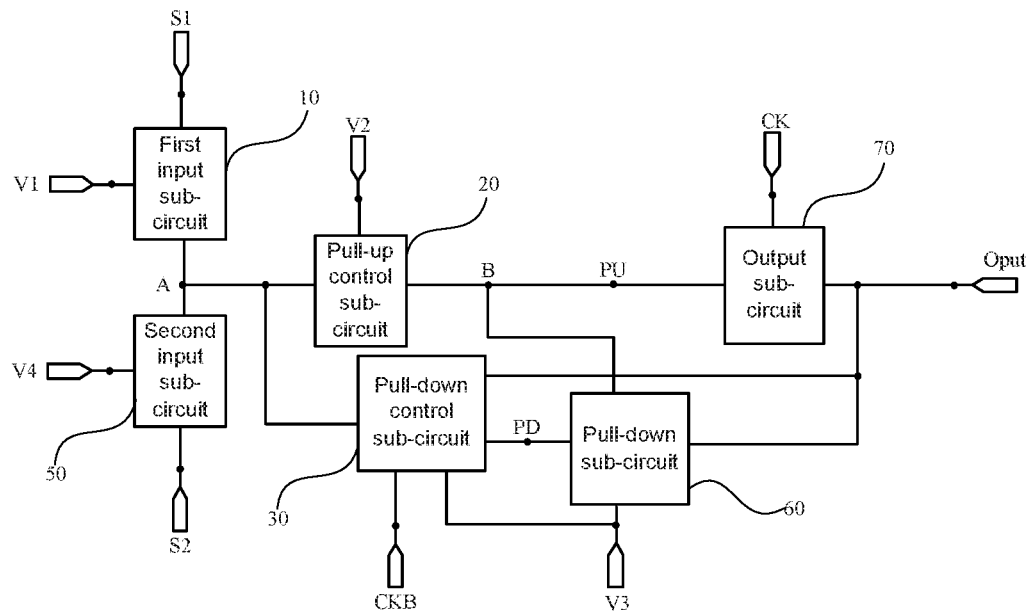
FIG. 1 is a schematic structural diagram of a shift register, in accordance with some embodiments of the present disclosure.

Some embodiments of the present disclosure provide a shift register. As shown in FIG. 1, the shift register includes a first input sub-circuit 10, a pull-up control sub-circuit 20 and a pull-down control sub-circuit 30.

The first input sub-circuit 10 is coupled to a first signal terminal S1, a first voltage terminal V1 and a first node A. The first input sub-circuit 10 is configured to transmit a voltage from the first signal terminal S1 to the first node A under control of a voltage from the first voltage terminal V1.

The pull-up control sub-circuit 20 is coupled to the first node A, a second voltage terminal V2 and a second node B. The pull-up control sub-circuit 20 is configured to be in a turn-on or turn-off state under control of a voltage from the first node A and transmit a voltage from the second voltage terminal V2 to the second node B when the pull-up control sub-circuit 20 is in the turn-on state.

The pull-down control sub-circuit 30 is coupled to the first node A, a third voltage terminal V3, a first clock signal terminal CKB, a signal output terminal OUTPUT (represented by Oput hereinafter and in the drawings) and a pull-down node PD. The pull-down control sub-circuit 30 is configured to transmit a voltage from the third voltage terminal V3 to the pull-down node PD under control of a voltage from the first node A. The pull-down control sub-circuit 30 is further configured to transmit the voltage from the third voltage terminal V3 to the pull-down node PD under control of a voltage from the signal output terminal Oput. The pull-down control sub-circuit 30 is further configured to transmit a voltage from the first clock signal terminal CKB to the pull-down node PD under control of the voltage from the first clock signal terminal CKB.

The second node B is coupled to a pull-up node PU.

The pull-up node PU is configured to control the signal output terminal Oput of the shift register to output a gate scanning signal, and the pull-down node PD is configured to stop the signal output terminal Oput from outputting the gate scanning signal.

In some embodiments, the description that the pull-up node PU is configured to control the signal output terminal Oput to output the gate scanning signal means that, the pull-up node PU is configured to control the signal output terminal Oput to output a high level signal. The description that the pull-down node PD is configured to stop the signal output terminal Oput from outputting the gate scanning signal means that, the pull-down node PD is configured to control the signal output terminal Oput to output a low level signal. In some other embodiments, the description that the pull-up node PU is configured to control the signal output terminal Oput to output the gate scanning signal means that, the pull-up node PU is configured to control the signal output terminal Oput to output a low level signal. The description that the pull-down node PD is configured to stop the signal output terminal Oput from outputting the gate scanning signal means that, the pull-down node PD is configured to control the signal output terminal Oput to output a high level signal.

The following embodiments of the present disclosure will be described by taking an example in which the pull-up node PU is configured to control the signal output terminal Oput to output the high level signal, and the pull-down node PD is configured to control the signal output terminal Oput to output the low level signal.

A person skilled in the art will appreciate that the pull-up node PU and the pull-down node PD in the shift register are generally in opposite states. For example, when the pull-up node PU is in an active state (e.g., the pull-up node PU outputs a high level signal), the pull-down node PD is in an inactive state (e.g., the pull-down node PD outputs a low level signal). When the pull-up node PU is in the inactive state (e.g., the pull-up node PU outputs a low level signal), the pull-down node PD is in the active state (e.g., the pull-down node PD outputs a high level signal).

In some embodiments, as shown in FIG. 1, in the shift register, the pull-up node PU is coupled to an output sub-circuit 70, and the output sub-circuit 70 is turned on under control of a voltage on the pull-up node PU so as to output the gate scanning signal via the signal output terminal Oput. The pull-down node PD is coupled to a pull-down sub-circuit 60, and the pull-down sub-circuit 60 is turned on under control of a voltage on the pull-down node PD to stop the signal output terminal Oput from outputting the gate scanning signal.

In some embodiments, the description that the second node B is coupled to the pull-up node PU means that, as shown in FIG. 1, the second node B is directly coupled to the pull-up node PU (the two nodes coincide as one node). In some other embodiments, the description that the second node B is coupled to the pull-up node PU means that, the second node B and the pull-up node PU are coupled through sub-circuit(s), so that when the sub-circuit(s) are turned on, the second node B is coupled to the pull-up node PU.

With regard to the shift register provided by the embodiments of the present disclosure, in a case where the shift register is applied to the gate driving circuit, in the pull-down period, the first node A may be disconnected from the first node B by turning off the pull-up control sub-circuit 20, and the voltage from the first clock signal terminal CKB may be output to the pull-down node PD by using the pull-down control sub-circuit 30 of the shift register in the present stage, thereby pulling down a potential on the pull-up node PU, and outputting a low-level voltage to the signal output terminal Oput, so that the shift register completes the work in the pull-down period. Therefore, the pull-down period of the shift register is independent of signals output by shift registers in other stages, thereby improving a stability of the gate driving circuit to a certain extent.

Figure 2:
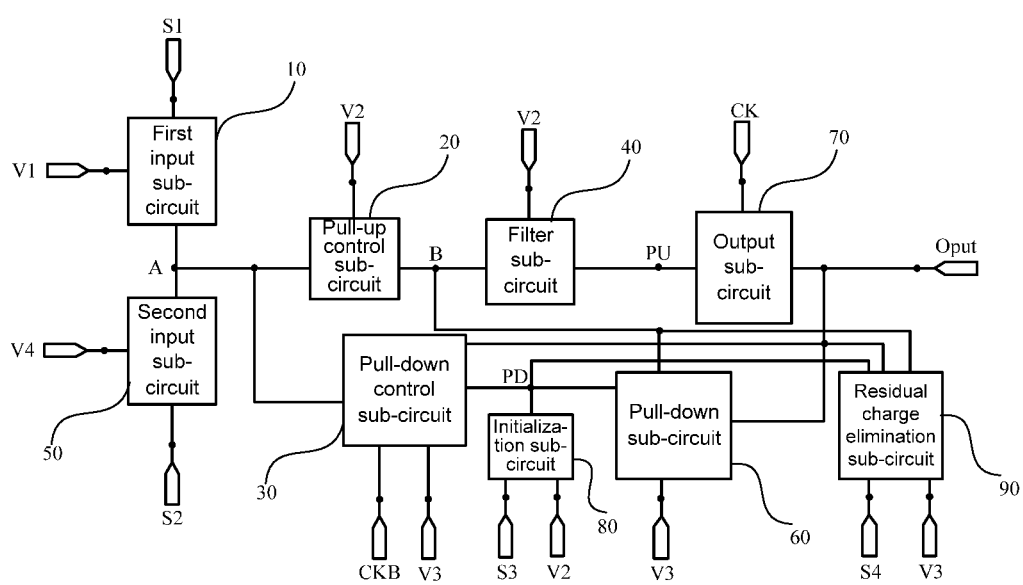
FIG. 2 is a schematic structural diagram of another shift register, in accordance with some embodiments of the present disclosure.

On this basis, in order to improve qualities of signals input to the pull-up node PU, as shown in FIG. 2, in some embodiments, the shift register further includes a filter sub-circuit 40.

The filter sub-circuit 40 is coupled to the second node B, the pull-up node PU and the second voltage terminal V2. The filter sub-circuit 40 is configured, under control of the voltage from the second voltage terminal V2, to filter noises in the voltage input via the second node B to the filter sub-circuit 40, and transmit the filter voltage to the pull-up node PU.

In some embodiments, in order to enable the shift register to achieve a forward scan and a reverse scan, as shown in FIGS. 1 and 2, the shift register further includes a second input sub-circuit 50.

The second input sub-circuit 50 is coupled to a second signal terminal S2, a fourth voltage terminal V4 and the first node A. The second input sub-circuit 50 is configured to transmit a voltage from the second signal terminal S2 to the first node A under control of a voltage from the fourth voltage terminal V4.

It will be noted here that whether the forward scan or the reverse scan is performed, only one of the first input sub-circuit 10 and the second input sub-circuit 50 is turned on while another is turned off during an entire driving process. In some embodiments, when the first input sub-circuit 10 is turned on and the second input sub-circuit 50 is turned off, the forward scan is achieved. When the second input sub-circuit 50 is turned on and the first input sub-circuit 10 is turned off, the reverse scan is achieved. In some other embodiments, when the first input sub-circuit 10 is turned on and the second input sub-circuit 50 is turned off, the reverse scan is achieved. When the second input sub-circuit 50 is turned on and the first input sub-circuit 10 is turned off, the forward scan is achieved.

In some embodiments, as shown in FIGS. 1 and 2, the shift register further includes the pull-down sub-circuit 60 and the output sub-circuit 70.

The pull-down sub-circuit 60 is coupled to the pull-down node PD, the second node B, the signal output terminal Oput and the third voltage terminal V3. The pull-down sub-circuit 60 is configured to transmit the voltage from the third voltage terminal V3 to the second node B and the signal output terminal Oput under control of a voltage on the pull-down node PD.

The output sub-circuit 70 is coupled to the pull-up node PU, a second clock signal terminal CK and the signal output terminal Oput. The output sub-circuit 70 is configured to transmit a voltage from the second clock signal terminal CK to the signal output terminal Oput under control of a voltage on the pull-up node PU.

In the case where the shift register is applied to the gate driving circuit, in order to initialize the shift register to ensure a stable display, in some embodiments, as shown in FIG. 2, the shift register further includes an initialization sub-circuit 80.

The initialization sub-circuit 80 is coupled to a third signal terminal S3, the second voltage terminal V2 and the pull-down node PD. The initialization sub-circuit 80 is configured to transmit the voltage from the second voltage terminal V2 to the pull-down node PD under control of a voltage from the third signal terminal S3 for initialization.

In a case of a failure of the shift register, in order not to affect a use of the shift register after a restart, in some embodiments, as shown in FIG. 2, the shift register further includes a residual charge elimination sub-circuit 90.

The residual charge elimination sub-circuit 90 is coupled to a fourth signal terminal S4, the third voltage terminal V3, the second node B, the pull-down node PD and the signal output terminal Oput. The residual charge elimination sub-circuit 90 is configured to transmit the voltage from the third voltage terminal V3 to the second node B and the pull-down node PD under control of a voltage from the fourth signal terminal S4. The residual charge elimination sub-circuit 90 is further configured to transmit a voltage from the fourth signal terminal S4 to the signal output terminal Oput under the control of the voltage from the fourth signal terminal S4 to eliminate the residual charge.

Exemplary structures of the sub-circuits in the shift register described above will be described in detail below.

Figure 3:
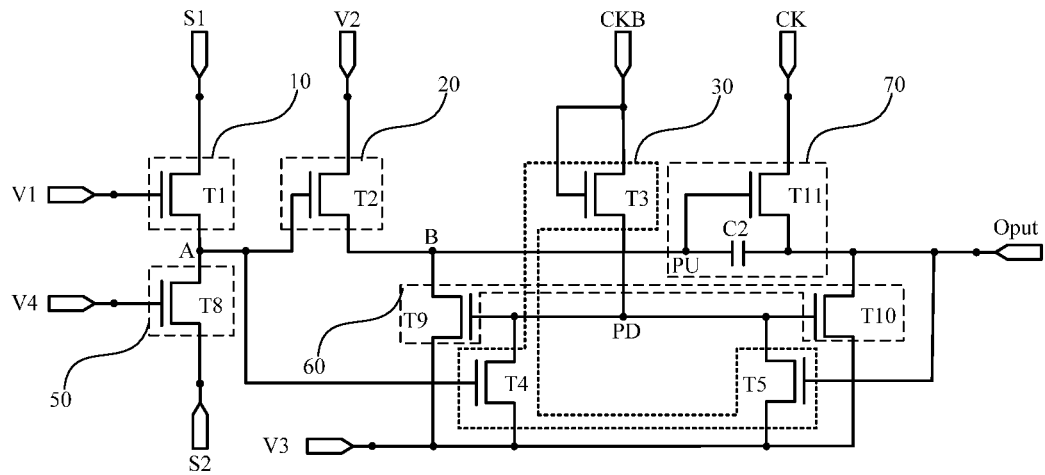
FIG. 3 is a schematic structural diagram of yet another shift register, in accordance with some embodiments of the present disclosure.
Figure 4:
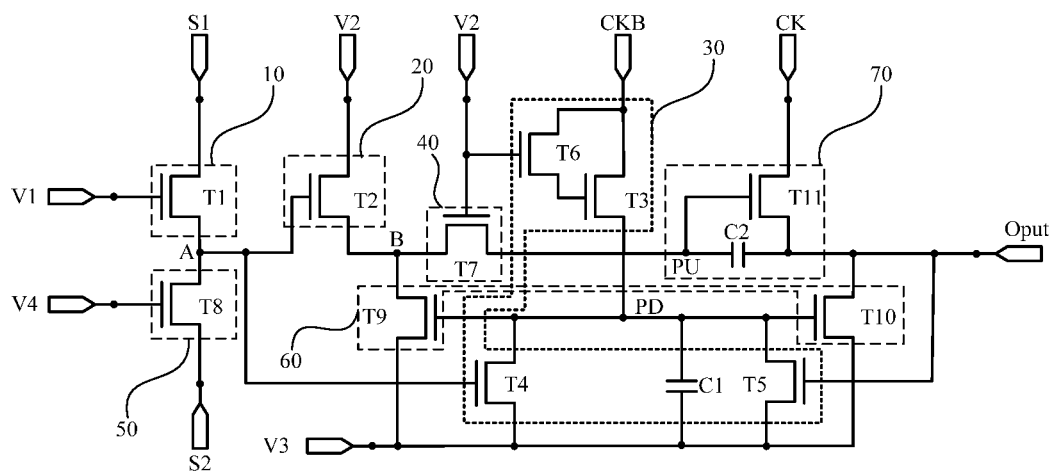
FIG. 4 is a schematic structural diagram of yet another shift register, in accordance with some embodiments of the present disclosure.
Figure 5:
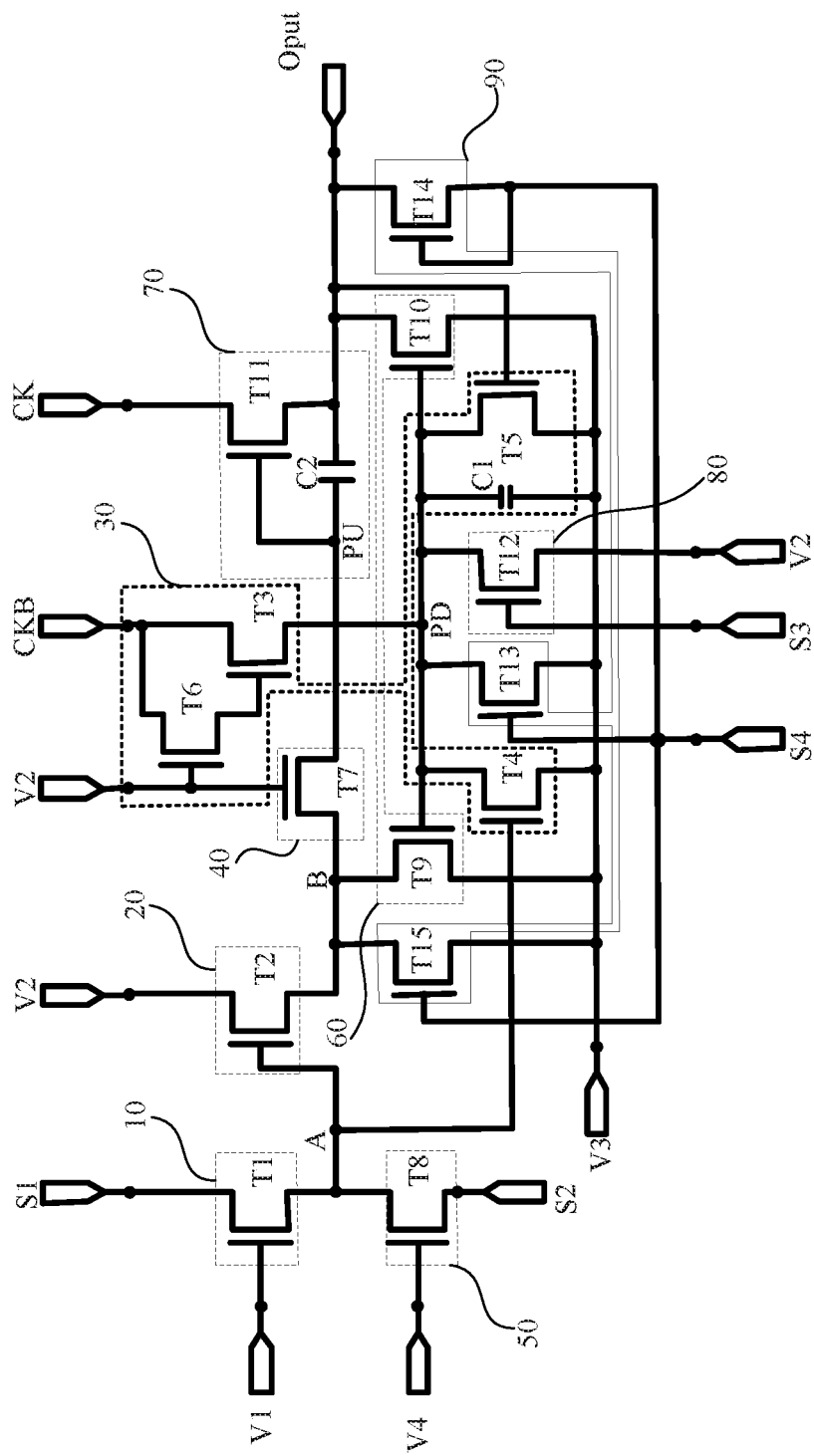
FIG. 5 is a schematic structural diagram of yet another shift register, in accordance with some embodiments of the present disclosure.

In some embodiments, as shown in FIGS. 3, 4, and 5, the first input sub-circuit 10 includes a first transistor T1.

The first transistor T1 includes a gate, a first electrode and a second electrode. The gate of the first transistor T1 is coupled to the first voltage terminal V1, the first electrode of the first transistor T1 is coupled to the first signal terminal S1, and the second electrode of the first transistor T1 is coupled to the first node A.

In some embodiments, as shown in FIGS. 3, 4, and 5, the pull-up control sub-circuit 20 includes a second transistor T2.

The second transistor T2 includes a gate, a first electrode and a second electrode. The gate of the second transistor T2 is coupled to the first node A, the first electrode of the second transistor T2 is coupled to the second voltage terminal V2, and the second electrode of the second transistor T2 is coupled to the second node B.

In some embodiments, as shown in FIGS. 3, 4, and 5, the pull-down control sub-circuit 30 includes a third transistor T3, a fourth transistor T4 and a fifth transistor T5.

The third transistor T3 includes a gate, a first electrode and a second electrode. The gate of the third transistor T3 is coupled to the first clock signal terminal CKB, the first electrode of the third transistor T3 is coupled to the first clock signal terminal CKB, and the second electrode of the third transistor T3 is coupled to the pull-down node PD.

The fourth transistor T4 includes a gate, a first electrode and a second electrode. The gate of the fourth transistor T4 is coupled to the first node A, the first electrode of the fourth transistor T4 is coupled to the pull-down node PD, and the second electrode of the fourth transistor T4 is coupled to the third voltage terminal V3.

The fifth transistor T5 includes a gate, a first electrode and a second electrode. The gate of the fifth transistor T5 is coupled to the signal output terminal Oput, the first electrode of the fifth transistor T5 is coupled to the pull-down node PD, and the second electrode of the fifth transistor T5 is coupled to the third voltage terminal V3.

In some embodiments, as shown in FIGS. 4 and 5, the pull-down control sub-circuit 30 further includes a sixth transistor T6.

The sixth transistor T6 includes a gate, a first electrode and a second electrode. The gate of the sixth transistor T6 is coupled to the second voltage terminal V2, the first electrode of the sixth transistor T6 is coupled to the first clock signal terminal CKB, and the second electrode of the sixth transistor T6 is coupled to the gate of the third transistor T3.

In some embodiments, as shown in FIGS. 4 and 5, the pull-down control sub-circuit 30 further includes a first capacitor C1.

The first capacitor C1 includes a first electrode and a second electrode. The first electrode of the first capacitor C1 is coupled to the pull-down node PD, and the second electrode of the first capacitor C1 is coupled to the third voltage terminal V3.

In some embodiments, as shown in FIGS. 4 and 5, the filter sub-circuit 40 includes a seventh transistor T7.

The seventh transistor T7 includes a gate, a first electrode and a second electrode. The gate of the seventh transistor T7 is coupled to the second voltage terminal V2, the first electrode of the seventh transistor T7 is coupled to the second node B, and the second electrode of the seventh transistor T7 is coupled to the pull-up node PU.

In some embodiments, as shown in FIGS. 3, 4, and 5, the second input sub-circuit 50 includes an eighth transistor T8.

The eighth transistor T8 includes a gate, a first electrode and a second electrode. The gate of the eighth transistor T8 is coupled to the fourth voltage terminal V4, the first electrode of the eighth transistor T8 is coupled to the first node A, and the second electrode of the eighth transistor T8 is coupled to the second signal terminal S2.

In some embodiments, as shown in FIGS. 3, 4, and 5, the pull-down sub-circuit 60 includes a ninth transistor T9 and a tenth transistor T10.

The ninth transistor T9 includes a gate, a first electrode and a second electrode. The gate of the ninth transistor T9 is coupled to the pull-down node PD, the first electrode of the ninth transistor T9 is coupled to the second node B, and the second electrode of the ninth transistor T9 is coupled to the third voltage terminal V3.

The tenth transistor T10 includes a gate, a first electrode and a second electrode. The gate of the tenth transistor T10 is coupled to the pull-down node PD, the first electrode of the tenth transistor T10 is coupled to the signal output terminal Oput, and the second electrode of the tenth transistor T10 is coupled to the third voltage terminal V3.

In some embodiments, as shown in FIGS. 3, 4, and 5, the output sub-circuit 70 includes an eleventh transistor T11 and a second capacitor C2.

The second capacitor C2 includes a first electrode and a second electrode. The first electrode of the second capacitor C2 is coupled to the pull-up node PU, and the second electrode of the second capacitor C2 is coupled to the signal output terminal Oput.

The eleventh transistor T11 includes a gate, a first electrode and a second electrode. The gate of the eleventh transistor T11 is coupled to the pull-up node PU, the first electrode of the eleventh transistor T11 is coupled to the second clock signal terminal CK, and the second electrode of the eleventh transistor T11 is coupled to the signal output terminal Oput.

In some embodiments, as shown in FIG. 5, the initialization sub-circuit 80 includes a twelfth transistor T12.

The twelfth transistor T12 includes a gate, a first electrode and a second electrode. The gate of the twelfth transistor T12 is coupled to the third signal terminal S3, the first electrode of the twelfth transistor T12 is coupled to the pull-down node PD, and the second electrode of the twelfth transistor T12 is coupled to the second voltage terminal V2.

In some embodiments, as shown in FIG. 5, the residual charge elimination sub-circuit 90 includes a thirteenth transistor T13, a fourteenth transistor T14 and a fifteenth transistor T15.

The thirteenth transistor T13 includes a gate, a first electrode and a second electrode. The gate of the thirteenth transistor T13 is coupled to the fourth signal terminal S4, the first electrode of the thirteenth transistor T13 is coupled to the pull-down node PD, and the second electrode of the thirteenth transistor T13 is coupled to the third voltage terminal V3.

The fourteenth transistor T14 includes a gate, a first electrode and a second electrode. The gate of the fourteenth transistor T14 is coupled to the fourth signal terminal S4, the first electrode of the fourteenth transistor T14 is coupled to the signal output terminal Oput, and the second electrode of the fourteenth transistor T14 is coupled to the fourth signal terminal S4.

The fifteenth transistor T15 includes a gate, a first electrode and a second electrode. The gate of the fifteenth transistor T15 is coupled to the fourth signal terminal S4, the first electrode of the fifteenth transistor T15 is coupled to the second node B, and the second electrode of the fifteenth transistor T15 is coupled to the third voltage terminal V3.

Figure 6:
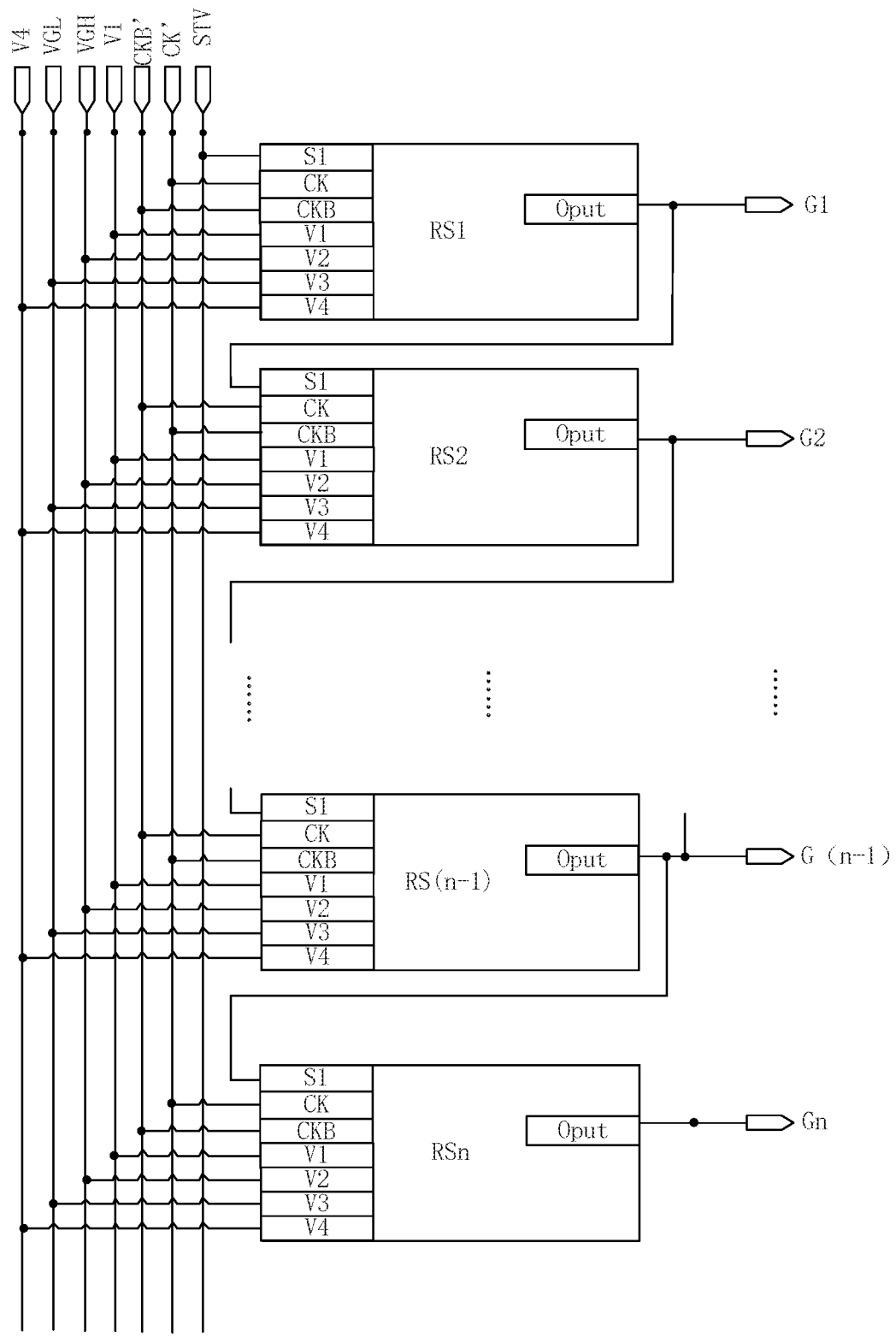
FIG. 6 is a schematic structural diagram of a gate driving circuit, in accordance with some embodiments of the present disclosure.
Figure 7:
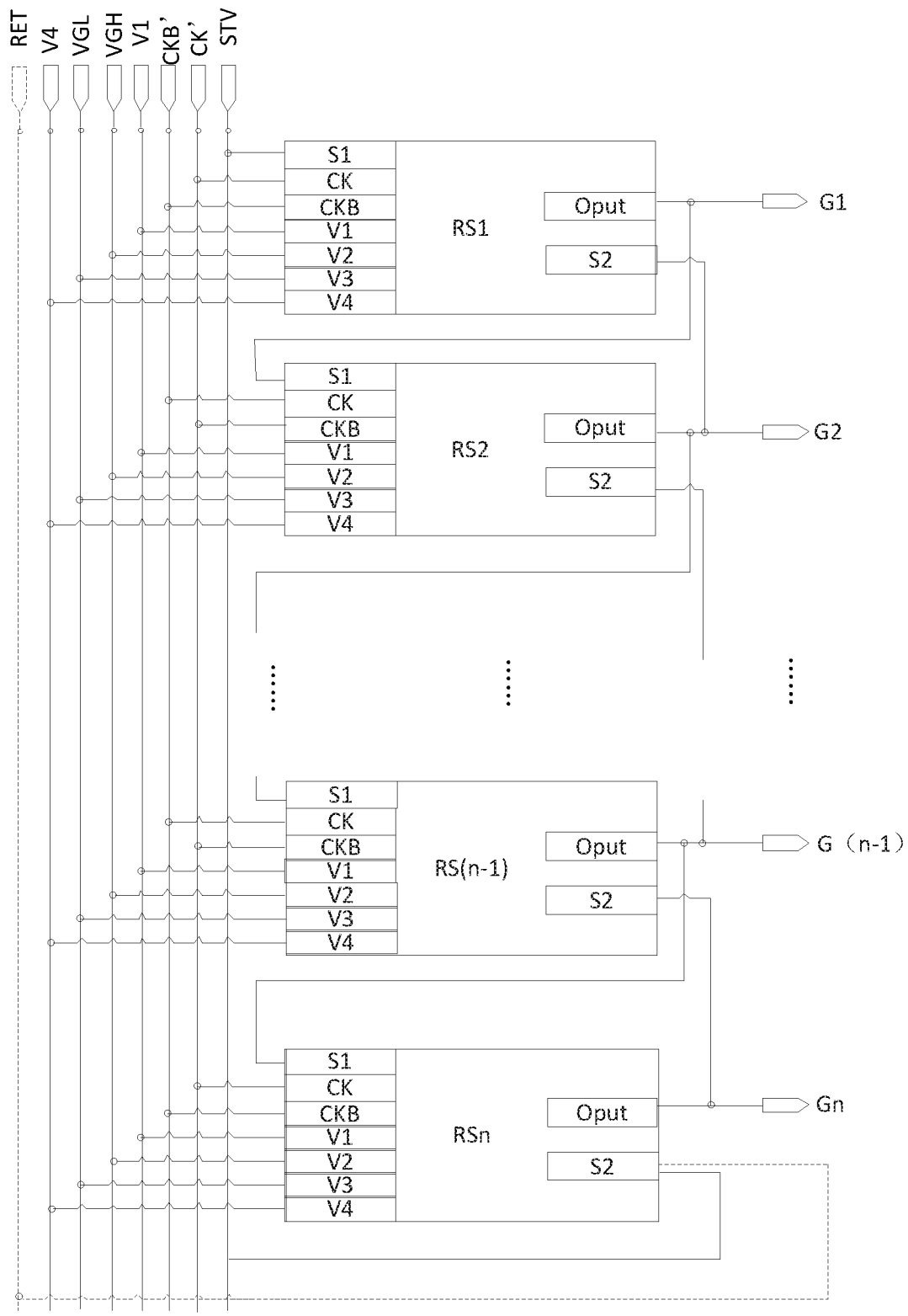
FIG. 7 is a schematic structural diagram of another gate driving circuit, in accordance with some embodiments of the present disclosure.

Some embodiments of the present disclosure provide a gate driving circuit. As shown in FIGS. 6 and 7, the gate driving circuit includes at least two stages of the above shift registers coupled in cascade.

In some embodiments, a first signal terminal S1 of a first-stage shift register RS1 is coupled to a start signal terminal STV. A first signal terminal S1 of each stage of shift register RS(n) except for the first-stage shift register RS1 is coupled to a signal output terminal Oput of a shift register in a previous stage RS(n−1), and n is an integer greater than 1. The start signal terminal STV is configured to output a start signal, and the gate driving circuit is configured to start to scan gate lines (G1, G2, . . . , Gn) line by line in response to the first-stage shift register RS1 receiving the above start signal. That is, in this case, the gate driving circuit performs the forward scan on the gate lines.

Figure 8:
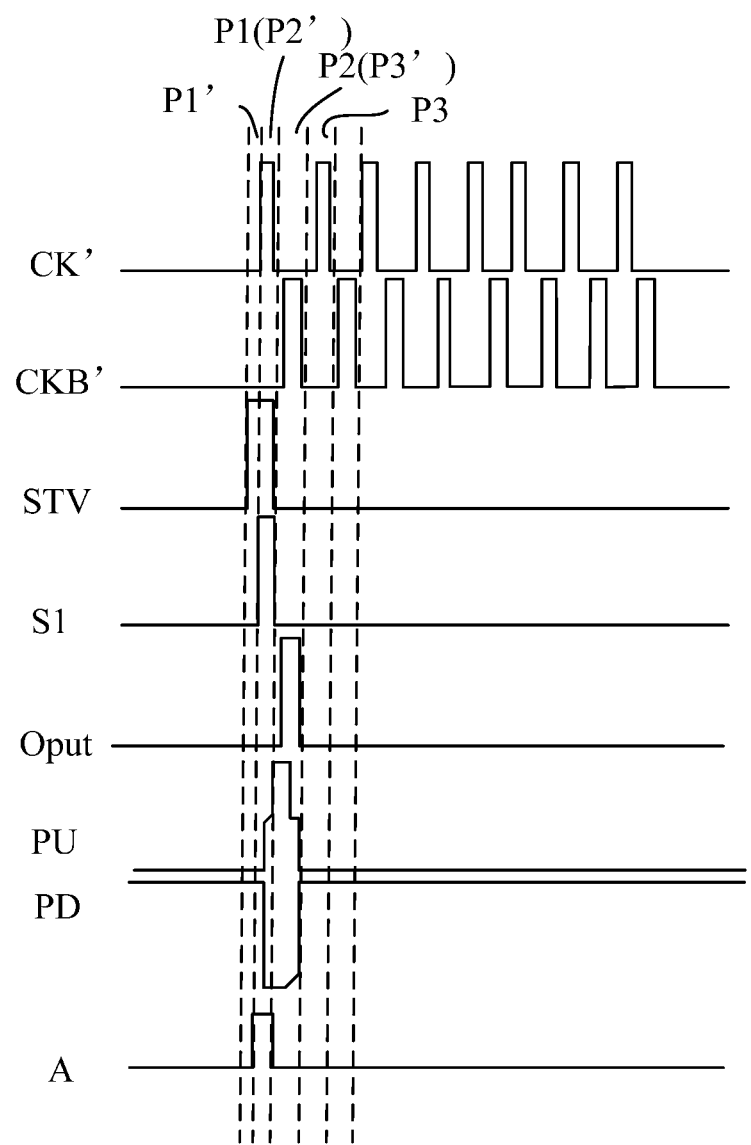
FIG. 8 is a diagram showing timings of control signals of a shift register, in accordance with some embodiments of the present disclosure.

In some embodiments, in a case where the shift register further includes the second input sub-circuit 50, as shown in FIG. 7, a second signal terminal S2 of each stage of shift register RS(m) except for a last-stage shift register is coupled to a signal output terminal Oput of a shift register in a next stage RS(m+1), and m is an integer greater than or equal to 1. A second signal terminal S2 of the last-stage shift register is coupled to the start signal terminal STV or a reset signal terminal RET (FIG. 8 shows an example in which the second signal terminal S2 of the last-stage shift register is coupled to the start signal terminal STV).

In the case where the second signal terminal S2 of the last-stage shift register is coupled to the start signal terminal STV, the start signal terminal STV is configured to output the start signal, and the gate driving circuit starts to scan gate lines (Gm . . . G2, G1) line by line in response to the last-stage shift register receiving the above start signal. That is, in this case, the gate driving circuit performs the reverse scan on the gate lines.

It will be noted that, as will be seen from the above description of the forward scan and the reverse scan of the gate driving circuit, in a case where the shift register includes both the first input sub-circuit 10 and the second input sub-circuit 50, only one of the first input sub-circuit 10 and the second input sub-circuit 50 is turned on while another is turned off during the entire driving process. That is, when the shift register in the gate driving circuit includes both the first input sub-circuit 10 and the second input sub-circuit 50, the gate driving circuit either performs the forward scan on the gate lines or performs the reverse scan on the gate lines (depending on a specific cascading method).

In some embodiments, in a case where the shift register includes the output sub-circuit 70, as shown in FIGS. 6 and 7, first clock signal terminal(s) CKB in the odd-numbered stage(s) of shift register(s) are coupled to a first clock signal line CKB', and second clock signal terminal(s) CK in the odd-numbered stage(s) of shift register(s) are coupled to a second clock signal line CK'. First clock signal terminal(s) CKB in the even-numbered stage(s) of shift register(s) are coupled to the second clock signal line CK', and second clock signal terminal(s) CK in the even-numbered stage(s) of shift register(s) are coupled to the first clock signal line CKB'. That is, a signal is input to the first clock signal terminal(s) CKB in the odd-numbered stage(s) of shift register(s) via the first clock signal line CKB', and a signal is input to the second clock signal terminal(s) CK in the even-numbered stage(s) of shift register(s) via the first clock signal line CKB'. A signal is input to the second clock signal terminal(s) CK in the odd-numbered stage(s) of shift register(s) via the second clock signal line CK', and a signal is input to the first clock signal terminal(s) CKB in the even-numbered stage(s) of shift register(s) via the second clock signal line CK'. Beneficial effects of the gate driving circuit provided by the embodiments of the present disclosure are the same as beneficial effects of the above shift register, which are not described here again.

Some embodiments of the present disclosure provide a display device. The display device includes any gate driving circuit of the gate driving circuits described above and has the same beneficial effects as the foregoing gate driving circuit. Since a structure and the beneficial effects of the gate driving circuit have been described in detail in the foregoing embodiments, details are not described herein again.

It will be noted that, in some embodiments of the present disclosure, the display device includes at least a liquid crystal display panel or an organic light-emitting diode display panel. For example, the display panel may be applied to any product or component having a display function such as a display, a television, a digital photo frame, a mobile phone or a tablet computer.

The driving process of the shift register will be further described below in combination with the above gate driving circuit. The transistors in the sub-circuits of the shift register provided by the embodiments of the present disclosure may be N-type transistors or P-type transistors. In addition, the above transistors may be enhancement-mode transistors or depletion-mode transistors. The first electrodes of the above transistors may be drains, and the second electrodes of the transistors may be sources. Alternatively, the first electrodes of the above transistors may be sources, and the second electrodes of the transistors may be drains, which is not limited by the present disclosure.

Hereinafter, turn-on and turn-off condition of the shift register shown in FIG. 5 in different periods of one image frame (e.g., a U-th frame, U is greater than or equal to 1, and U is a positive integer) is described in detail by taking an example in which the above transistors are all N-type transistors in combination with the timing diagram of signals shown in FIG. 8. The first clock signal terminal CKB and the second clock signal terminal CK are complementary signals, and the first voltage terminal V1 and the fourth voltage terminal V4 are at a high level and a low level for controlling the forward scan and the reverse scan.

The following embodiments are described by taking an example in which a high level is constantly output from the second voltage terminal V2 and a low level is constantly output from the third voltage terminal V3. In addition, the following embodiments are described by taking the forward scan as an example. That is, the following embodiments are described by taking an example in which the first input sub-circuit 10 works and the second input sub-circuit 50 does not work (i.e., a high level signal is input via the first voltage terminal V1, and a low level signal is input via the fourth voltage terminal V4).

A driving method of the shift register includes an input period, an output period and a pull-down period.

There is a certain difference in control signals in the input period as for the first-stage shift register RS1 and the shift registers (RS2, RS3, . . . , RSn) after the first-stage shift register RS1. The difference between the first-stage shift register RS1 and the shift registers (RS2, RS3, . . . , RSn) after the first-stage shift register RS1 in the input period will be described below by taking the gate driving circuit in FIG. 7 as an example and in combination with the timing diagram of control signals shown in FIG. 8.

With reference to FIG. 8, taking the first-stage shift register RS1 and a second-stage shift register RS2 as an example, a driving process of the first-stage shift register RS1 includes an input period P1', an output period P2' and a pull-down period P3'. A driving process of the second-stage shift register RS2 includes an input period P1, an output period P2 and a pull-down period P3. The output period P2' of the first-stage shift register RS1 and the input period P1 of the second-stage shift register RS2 are a same period. The pull-down period P3' of the first-stage shift register RS1 and the output period P2 of the second-stage shift register RS2 are the same period.

A difference between timing controls when the first-stage shift register RS1 and the second-stage shift register RS2 are in the input period is that when the first-stage shift register RS1 is in the input period P1', the first clock signal terminal CKB is at a low level, and when the second-stage shift register RS2 is in the input period P1, the first clock signal terminal CKB (corresponding to (CK') in FIG. 8) is at a high level, but both may ensure a normal operation of the gate driving circuit.

Hereinafter, turn-on and turn-off conditions of the transistors in the shift register in different periods of one image frame (e.g., the U-th frame, U is greater than or equal to 1, and U is a positive integer) are described in detail by taking the second-stage shift register RS2 as an example and in combination with the turn-on and turn-off conditions of the transistors in the shift register in FIG. 5 and the timing diagram shown in FIG. 8. In the input period P1, S1=1, CK=0 (corresponding to (CKB') in FIG. 8), CKB=1 (corresponding to (CK') in FIG. 8), S3=0, and S4=0. "0" indicates a low level, and "1" indicates a high level.

A high level is output from the first voltage terminal V1, and thus the first transistor T1 is turned on, thereby transmitting a high level of the first signal terminal S1 to the first node A, so that the second transistor T2 is controlled to be turned on, and the voltage from the second voltage terminal V2 is transmitted to the second node B via the second transistor T2. Since a high level is constantly output from the second voltage terminal V2, the seventh transistor T7 is a normally-on transistor. A high level on the second node B is filtered by the seventh transistor T7 and output to the pull-up node PU, and the filtered high level is stored by the second capacitor C2. Under control of a high potential on the pull-up node PU, the eleventh transistor T11 is turned on, so that a low level of the second clock signal terminal CK is transmitted to the signal output terminal Oput, and the fifth transistor T5 is turned off under control of the low level.

Moreover, the high level of the first signal terminal S1 is transmitted to the first node A, and the fourth transistor T4 is turned on under the control of the high level of the first node A, to transmit a low level of the third voltage terminal V3 to the pull-down node PD. In this case, even if under control of a high level output from the second voltage terminal V2, the sixth transistor T6 is turned on to transmit a high level of the first clock signal terminal CKB to the gate of the third transistor T3, so as to control the third transistor T3 to be turned on to transmit the high level of the first clock signal terminal CKB to the pull-down node PD, a voltage division of the third transistor T3, the fourth transistor T4 and the sixth transistor T6 at the pull-down node PD causes the ninth transistor T9 and the tenth transistor T10 to remain in the turn-off state to ensure a charging state of the pull-up node PU.

A low level is input via the third signal terminal S3 to control the twelfth transistor T12 to be turned off. A low level signal is input via the fourth signal terminal S4 to control the thirteenth transistor T13, the fourteenth transistor T14 and the fifteenth transistor T15 to be turned off.

In summary, in the input period P1, the first transistor T1 is turned on, the second transistor T2 is turned on, the third transistor T3 is turned on, the fourth transistor T4 is turned on, the fifth transistor T5 is turned off, the sixth transistor T6 is turned on, the seventh transistor T7 is turned on, the eighth transistor T8 is turned off, the ninth transistor T9 is turned off, the tenth transistor T10 is turned off, the eleventh transistor T11 is turned on, the twelfth transistor T12 is turned off, the thirteenth transistor T13 is turned off, the fourteenth transistor T14 is turned off, and the fifteenth transistor T15 is turned off. A low level is output from the signal output terminal Oput in the input period P1 described above.

In the output period P2, S1=0, CK=1, CKB=0, S3=0, and S4=0.

A high level is output from the first voltage terminal V1, and thus the first transistor T1 is turned on, to transmit a low level of the first signal terminal S1 to the first node A to control the second transistor T2 and the fourth transistor T4 to be turned off. The second capacitor C2 charges the pull-up node PU by using the high level stored in the input period P1, so that the eleventh transistor T11 remains in the turn-on state. In this case, a high level of the second clock signal terminal CK is transmitted to the signal output terminal Oput via the eleventh transistor T11, and thus the fifth transistor T5 is controlled to be turned on. The low level of the third voltage terminal V3 is transmitted to the pull-down node PD via the fifth transistor T5. The ninth transistor T9 and the tenth transistor T10 are turned off under the control of the low level of the pull-down node PD.

In addition, under a bootstrapping action of the second capacitor C2, the potential on the pull-up node PU is further increased (a potential on an end of the second capacitor C2 coupled to the signal output terminal Oput is suddenly changed from 0 to 1, and when the second capacitor C2 charges the pull-up node PU, the potential on the pull-up node PU is suddenly changed to a high potential by 1 again on the basis of 1), so as to maintain the eleventh transistor T11 in the turn-on state. Thereby, the high level of the second clock signal terminal CK may be output as a gate scanning signal to a gate line coupled to the signal output terminal Oput.

Moreover, the sixth transistor T6 is turned on under the control of a high level output from the second voltage terminal V2. A low level is output from the first clock signal terminal CKB to control the third transistor T3 to be turned off.

A low level is input via the third signal terminal S3 to control the twelfth transistor T12 to be turned off. A low level is input via the fourth signal terminal S4 to control the thirteenth transistor T13, the fourteenth transistor T14 and the fifteenth transistor T15 to be turned off.

In summary, in the output period P2, the first transistor T1 is turned on, the second transistor T2 is turned off, the third transistor T3 is turned off, the fourth transistor T4 is turned off, the fifth transistor T5 is turned on, the sixth transistor T6 is turned on, the seventh transistor T7 is turned on, the eighth transistor T8 is turned off, the ninth transistor T9 is turned off, the tenth transistor T10 is turned off, the eleventh transistor T11 is turned on, the twelfth transistor T12 is turned off, the thirteenth transistor T13 is turned off, the fourteenth transistor T14 is turned off, and the fifteenth transistor T15 is turned off. A high level is output from the signal output terminal Oput in the output period P2 described above so that a gate scanning signal is output to the gate line coupled to the signal output terminal Oput.

In the pull-down period P3, S1=0, CK=0, CKB=1, S3=0, and S4=0.

A high level is input via the first voltage terminal V1, and thus the first transistor T1 is turned on, to transmit the low level of the first signal terminal S1 to the first node A to control the second transistor T2 and the fourth transistor T4 to be turned off. The seventh transistor T7 and the sixth transistor T6 are turned on under the control of a high level output from the second voltage terminal V2, and a high level output from the first clock signal terminal CKB controls the third transistor T3 to be turned on, to transmit the high level output from the first clock signal terminal CKB to the pull-down node PD. The pull-down node PD controls both the ninth transistor T9 and the tenth transistor T10 to be turned on, and a potential on the second node B is pulled down to the low level of the third voltage terminal V3 via the ninth transistor T9. A low level of the second node B is filtered by the seventh transistor T7 to filter noises and then transmitted to the pull-up node PU. That is, the potential on the pull-up node PU is pulled down to the low level of the third voltage terminal V3, to control the eleventh transistor T11 to be turned off. A potential on the signal output terminal Oput is pulled down to the low level of the third voltage terminal V3 via the tenth transistor T10, and the fifth transistor T5 is controlled to be turned off. The first capacitor C1 stores a high level of the pull-down node PD, so that the pull-down node PD is maintained at a high level for a long time.

In addition, a low level is input via the third signal terminal S3 to control the twelfth transistor T12 to be turned off. A low level is input via the fourth signal terminal S4 to control the thirteenth transistor T13, the fourteenth transistor T14 and the fifteenth transistor T15 to be turned off.

In summary, in the pull-down period P3, the first transistor T1 is turned on, the second transistor T2 is turned off, the third transistor T3 is turned on, the fourth transistor T4 is turned off, the fifth transistor T5 is turned off, the sixth transistor T6 is turned on, the seventh transistor T7 is turned on, the eighth transistor T8 is turned off, the ninth transistor T9 is turned on, the tenth transistor T10 is turned on, the eleventh transistor T11 is turned off, the twelfth transistor T12 is turned off, the thirteenth transistor T13 is turned off, the fourteenth transistor T14 is turned off, and the fifteenth transistor T15 is turned off. A low level is output from the signal output terminal Oput in the pull-down period P1 described above.

It will be noted that, with regard to the shift register shown in FIG. 3, since the shift register does not include the sixth transistor T6, in the pull-down period P3 described above, the third transistor T3 is controlled to be turned on by using the high level of the first clock signal terminal CKB, and the high level of the first clock signal terminal CKB is transmitted to the pull-down node PD. In a case where the shift register includes the sixth transistor T6, the high level of the first clock signal terminal CKB is transmitted to the gate of the third transistor T3 via the the turned-on sixth transistor T6 to control the third transistor T3 to be turned on. The high level of the first clock signal terminal CKB is transmitted to the pull-down node PD via the third transistor T3.

Figure 9:
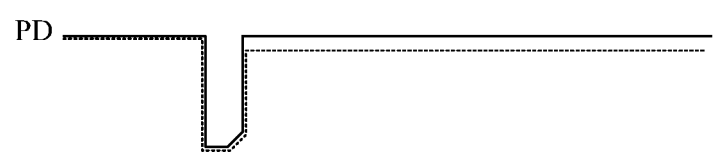
FIG. 9 is a schematic diagram showing a comparison of potentials on pull-down nodes of two types of shift registers, in accordance with some embodiments of the present disclosure.

In a case where the shift register does not include the sixth transistor T6, the voltage on the pull-down node PD is as shown by the broken line in FIG. 9. In the case where the shift register includes the sixth transistor T6, the voltage on the pull-down node PD is as shown by the solid line in FIG. 9. As will be seen from FIG. 9, in the case where the shift register does not include the sixth transistor T6, the voltage on the pull-down node PD in the shift register can not completely maintain a high level of a first clock signal (there is a loss) because the N-type transistor has an inevitable threshold loss when transmitting a high level, which causes the third transistor T3 to fail to reach a full amplitude value of the high-level when charging the pull-down node PD, and causes that there is a certain loss. In the case where the shift register includes the sixth transistor T6, the voltage on the pull-down node PD in the shift register, as shown in FIG. 9, may completely maintain the high level of the first clock signal. After the sixth transistor T6 is added, the sixth transistor T6 cooperates with the third transistor T3, so that the gate of the third transistor T3 is bootstrapped, so that the high level of the first clock signal terminal CKB may completely charge the pull-down node PD via the third transistor T3 to avoid the threshold loss, and the high level of the first clock signal terminal CKB is transmitted to the pull-down node PD without loss. A driving capability of a voltage signal from the pull-down node PD is improved and a waveform of the voltage signal is shaped, thereby ensuring a continuous stability of the voltage signal from the pull-down node PD, and improving a gate driving performance and a stability of the display.

Figure 10:
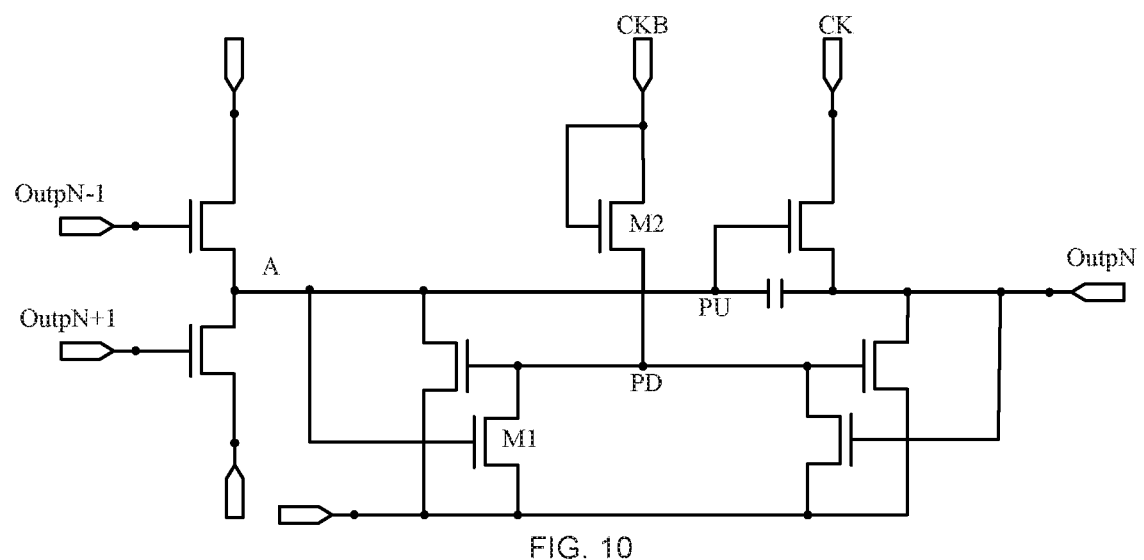
FIG. 10 is a schematic structural diagram of a shift register in the related art.
Figure 11:
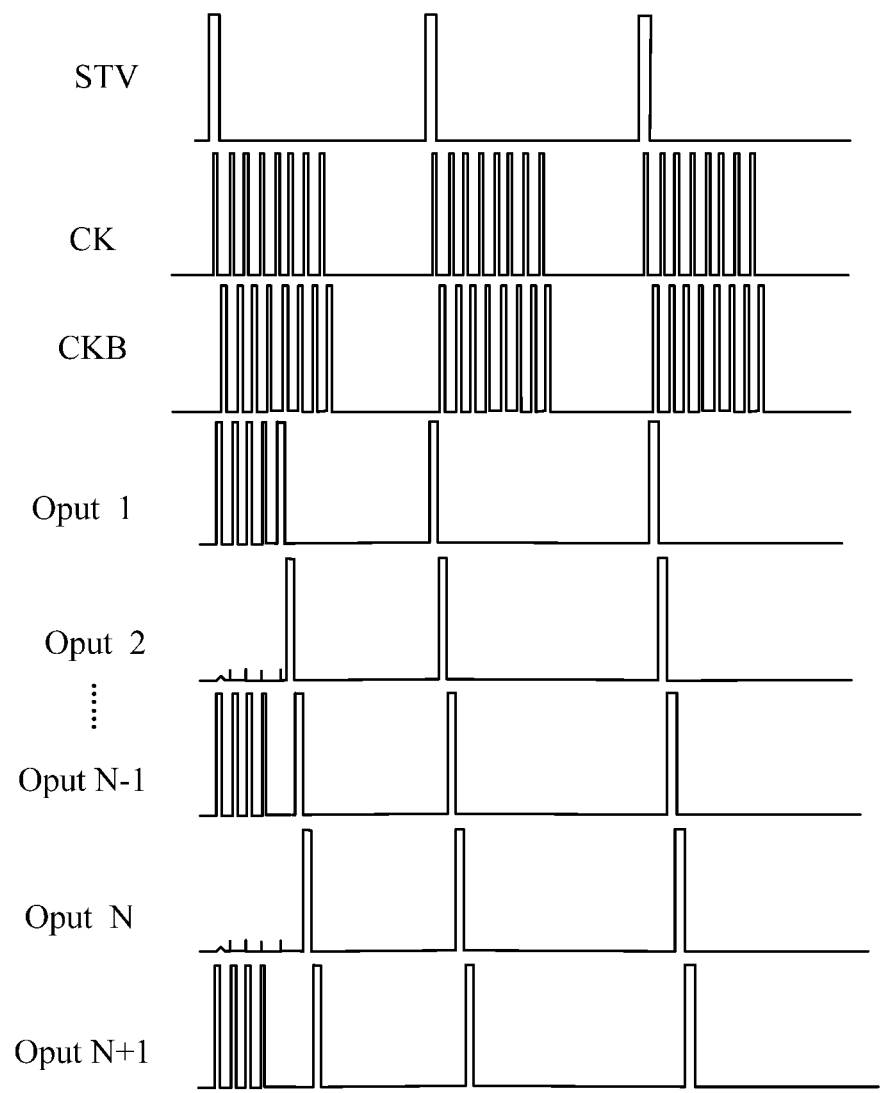
FIG. 11 is a timing diagram when control signals of a shift register in the related art are disordered.

With reference to the shift register in the related art in FIG. 10, an output of a low level by the shift register in the present stage in the pull-down period may not be achieved by the shift register in the present stage, but is completed by relying on a high level output from a signal output terminal (i.e., a terminal OputN+1) of the shift register in the next stage (that is, the transistor M1 in FIG. 10 remains in the turn-on state until the high level output from the shift register in the next stage comes). Thus, as shown in FIG. 11, in the case of an abnormal output of the shift register in the next stage, a reset of the shift register in the present stage in the pull-down period may not be achieved, thereby resulting in a subsequent chain abnormal output.

In addition, a signal output terminal OputN-1 of the shift register in the previous stage is coupled to a gate of a corresponding transistor in the shift register in the present stage in FIG. 10. However, in the shift register provided by the embodiments of the present disclosure, the second transistor T2 is added, and a coupling method of the signal output terminal Oput of the shift register in the previous stage to the shift register in the present stage is changed (the signal output terminal Oput of the shift register in the previous stage is not coupled to the gate of the first transistor T1 in the shift register in the present stage). Thereby, the reset and a maintenance of the reset of the shift register in the pull-down period are completed by the third transistor T3. In the shift register provided by the embodiments of the present disclosure, since the fourth transistor T4 in the shift register in the present stage remains in the turn-off state after a low level is input, that is, since the first node A is maintained at a low level after the input period (as shown in the timing of the point A in FIG. 8), the high level of the first clock signal terminal CKB may be transmitted to the pull-down node PD via the third transistor T3 to pull up a potential on the pull-down node PD and then pull down the potential on the pull-up node PU, thereby achieving the reset in the pull-down period, avoiding that the shift register in the present stage may not be reset due to the abnormal output of the shift register in the next stage, avoiding the subsequent chain abnormal output, and improving the gate driving performance and the stability of the display.

In a case where the shift register includes the initialization sub-circuit 80, in the initialization period, S1=0, CK=0, CKB=0, S3=1, and S4=0.

A high level is output from the third signal terminal S3 to control the twelfth transistor T12 to be turned on, to transmit a high level of the second voltage terminal V2 to the pull-down node PD. The pull-down node PD controls the ninth transistor T9 and the tenth transistor T10 to be turned on. The low level of the third voltage terminal V3 is transmitted to the pull-up node PU via the ninth transistor T9, and the low level of the third voltage terminal V3 is transmitted to the signal output terminal Oput via the tenth transistor T10, so as to pull down both the voltage on the pull-up node PU and the voltage on the signal output terminal Oput to complete the initialization of the shift register.

In summary, in the initialization period P4, the first transistor T1 is turned on, the second transistor T2 is turned off, the third transistor T3 is turned off, the fourth transistor T4 is turned off, the fifth transistor T5 is turned off, the sixth transistor T6 is turned on, the seventh transistor T7 is turned on, the eighth transistor T8 is turned off, the ninth transistor T9 is turned on, the tenth transistor T10 is turned on, the eleventh transistor T11 is turned off, the twelfth transistor T12 is turned on, the thirteenth transistor T13 is turned off, the fourteenth transistor T14 is turned off, and the fifteenth transistor T15 is turned off. A low level is output from the signal output terminal Oput in the initialization period P4 described above.

In a case where the shift register includes the residual charge elimination sub-circuit 90, each time the gate driving circuit is turned off, in a residual charge elimination period, S1=0, S3=0, and S4=1.

A high level is input via the fourth signal terminal S4 to control the thirteenth transistor T13, the fourteenth transistor T14 and the fifteenth transistor T15 to be turned on. The fourteenth transistor T14 is turned on, to transmit a high level of the fourth signal terminal S4 to the signal output terminal Oput, so that a high level is output from the signal output terminal Oput, so as to complete a discharge of an entire circuit and eliminate the residual charge in the circuit due to an abnormal display.

In order to ensure an effect of eliminating the residual charge, the fifteenth transistor T15 is turned on, to transmit a low level output from the third voltage terminal V3 to the pull-up node PU to prevent other signals from affecting the potential on the signal output terminal Oput.

Moreover, in order to further ensure the effect of eliminating the residual charge, the thirteenth transistor T13 is turned on, to transmit the low level output from the third voltage terminal V3 to the pull-down node PD to prevent other signals from affecting the potential on the signal output terminal Oput.

It will be noted that if the shift register does not include the above thirteenth transistor T13, the shift register may still work via the fourteenth transistor T14 to complete a residual charge elimination task.

The residual charge elimination sub-circuit 90 includes the thirteenth transistor T13, the fourteenth transistor T14 and the fifteenth transistor T15. The three transistors cooperate to maintain the pull-up node PU at a low level, thereby improving the gate driving performance and the stability of the display.

In summary, in the residual charge elimination period, the first transistor T1 is turned on, the second transistor T2 is turned off, the third transistor T3 is turned off, the fourth transistor T4 is turned off, the fifth transistor T5 is turned on, the sixth transistor T6 is turned on, the seventh transistor T7 is turned on, the eighth transistor T8 is turned off, the ninth transistor T9 is turned off, the tenth transistor T10 is turned off, the eleventh transistor T11 is turned off, the twelfth transistor T12 is turned off, the thirteenth transistor T13 is turned on, the fourteenth transistor T14 is turned on, and the fifteenth transistor T15 is turned on. A high level is output from the signal output terminal Oput in the residual charge elimination period P5 described above.

It will be noted that, turn-on and turn-off processes of the transistors in the above embodiments are described by taking an example in which all the transistors are the N-type transistors. In a case where all the transistors are the P-type transistors, respective control signals in FIG. 5 need to be inverted, and the turn-on and turn-off processes of the transistors in respective sub-circuits in the shift register are the same as above, which are not described herein again.

In addition, a working process of the above shift register is described by taking an example in which the gate driving circuit formed by cascading the plurality of shift registers uses a forward scan method. When the reverse scan is used, in the shift register shown in FIGS. 3, 4 and 5, in the input period P1, the first transistor T1 is turned off, and the eighth transistor T8 is turned on.

Figure 12:
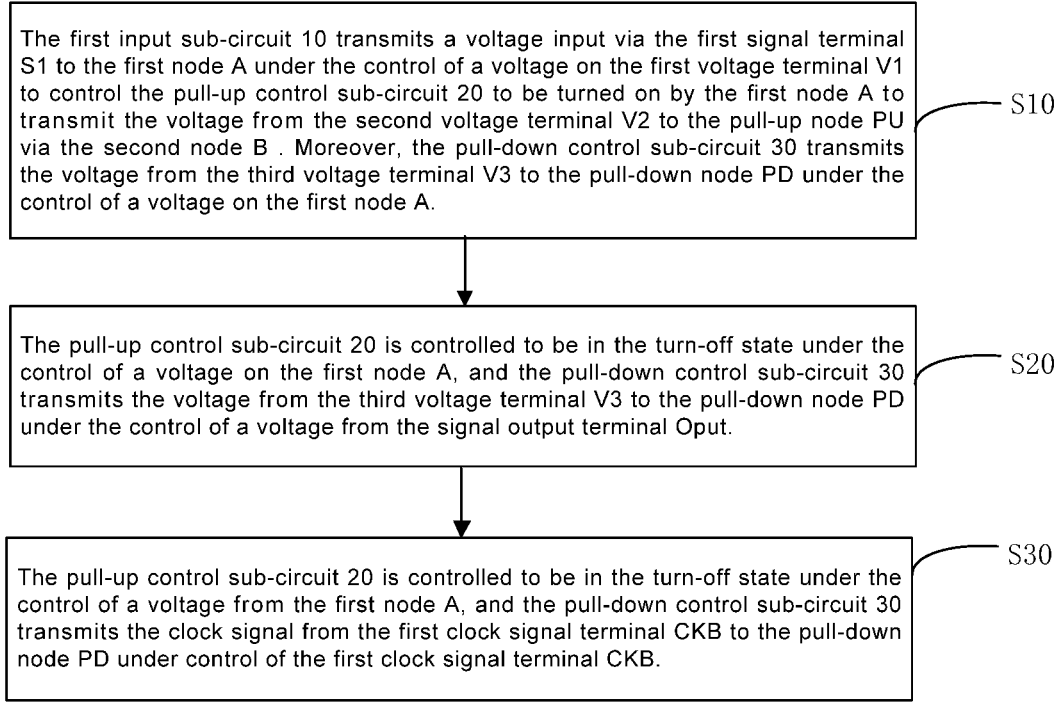
FIG. 12 is a flow diagram of a method for driving a shift register, in accordance with some embodiments of the present disclosure.

Some embodiments of the present disclosure provide a driving method of any shift register of the above shift registers. As shown in FIG. 12, the driving method includes steps 10-30 (S10-S30).

In the input period P1:

In S10, the first input sub-circuit 10 transmits a voltage input via the first signal terminal S1 to the first node A under the control of a voltage from the first voltage terminal V1 to control the pull-up control sub-circuit 20 to be turned on by the first node A so as to transmit the voltage from the second voltage terminal V2 to the pull-up node PU via the second node B. Moreover, the pull-down control sub-circuit 30 transmits the voltage from the third voltage terminal V3 to the pull-down node PD under the control of a voltage on the first node A.

In a case where the shift register further includes the filter sub-circuit 40, in the input period P1:

Under control of the first voltage terminal V1, the first input sub-circuit 10 transmits the voltage input via the first signal terminal 51 to the first node A, and the first node A controls the pull-up control sub-circuit 20 to be turned on, to transmit the voltage from the second voltage terminal V2 to the second node B. After filtering the noises in the voltage input via the second node B, the filter sub-circuit 40 outputs the filtered voltage to the pull-up node PU.

In a case where the shift register further includes the pull-down sub-circuit 60, the initialization sub-circuit 80 and the residual charge elimination sub-circuit 90, in the input period P1, the pull-down sub-circuit 60, the initialization sub-circuit 80 and the residual charge elimination sub-circuit 90 are all turned off. In some embodiments, the structures of the sub-circuits in the above shift register are as shown in FIG. 5, and the transistors in the sub-circuits are the N-type transistors. In the input period P1, a high level is input via the first signal terminal S1, a high level is input via the first clock signal terminal CKB, a low level is input via the second clock signal terminal CK, a low level is input via the third signal terminal S3, a low level is input via the fourth signal terminal S4, a high level is input via the first voltage terminal V1, a high level is input via the second voltage terminal V2, a low level is input via the third voltage terminal V3, a low level is input via the fourth voltage terminal V4, the pull-up node PU is at a high level, the pull-down node PD is at a low level, and a low level is output from the signal output terminal Oput.

In this case, since a high level is input via the first voltage terminal V1, the first transistor T1 is turned on, thereby transmitting the high level of the first signal terminal S1 to the first node A to control the second transistor T2 to be turned on. The voltage of the second voltage terminal V2 is transmitted to the second node B via the second transistor T2. Since a high level is input via the second voltage terminal V2, the seventh transistor T7 is the normally-on transistor. The high level on the second node B is filtered by the seventh transistor T7 and output to the pull-up node PU, and the filtered high level is stored by the second capacitor C2. The eleventh transistor T11 is turned on under control of a high level of the pull-up node PU, to transmit the low level of the second clock signal terminal CK to the signal output terminal Oput, and the fifth transistor T5 is controlled to be turned off.

Moreover, the high level of the first node A controls the fourth transistor T4 to be turned on, to transmit the low level of the third voltage terminal V3 to the pull-down node PD. In this case, even if under the control of a high level output from the second voltage terminal V2, the sixth transistor T6 is turned on, to transmit the high level of the first clock signal terminal CKB to the gate of the third transistor T3, so as to control the third transistor T3 to be turned on to transmits the high level of the first clock signal terminal CKB to the pull-down node PD, the voltage division of the third transistor T3, the fourth transistor T4 and the sixth transistor T6 at the pull-down node PD causes the ninth transistor T9 and the tenth transistor T10 to remain in the turn-off state to ensure the charging state of the pull-up node PU.

A low level is input via the third signal terminal S3 to control the twelfth transistor T12 to be turned off, and a low level is input via the fourth signal terminal S4 to control the thirteenth transistor T13, the fourteenth transistor T14 and the fifteenth transistor T15 to be turned off.

In the output period P2:

In S20, the pull-up control sub-circuit 20 is controlled to be in the turn-off state under the control of a voltage on the first node A, and the pull-down control sub-circuit 30 transmits the voltage of the third voltage terminal V3 to the pull-down node PD under the control of a voltage from the signal output terminal Oput.

In the output period P2, the output sub-circuit 70 transmits a clock signal (a high potential) from the second clock signal terminal CK to the signal output terminal Oput under the control of a voltage on the pull-up node PU, to output a gate scanning signal via the signal output terminal Oput.

Moreover, the pull-down control sub-circuit 30 transmits the low level of the third voltage terminal V3 to the pull-down node PD under control of a high level output from the signal output terminal Oput to control the pull-down sub-circuit 60 to be turned off. Both the initialization sub-circuit 80 and the residual charge elimination sub-circuit 90 are turned off.

In some embodiments, the structures of the sub-circuits in the above shift register are as shown in FIG. 5, and the transistors in the respective sub-circuits are the N-type transistors. In the output period P2, a low level is input via the first signal terminal S1, a high level is input via the second clock signal terminal CK, a low level is input via the first clock signal terminal CKB, a low level is input via the third signal terminal S3, a low level is input via the fourth signal terminal S4, a high level is input via the first voltage terminal V1, a high level is input via the second voltage terminal V2, a low level is input via the third voltage terminal V3, a low level is input via the fourth voltage terminal V4, the pull-up node PU is at a high level, the pull-down node PD is at a low level, and a high level is output from the signal output terminal Oput.

In this case, since a high level is input via the first voltage terminal V1, the first transistor T1 is turned on, thereby transmitting the low level of the first signal terminal S1 to the first node A to control the second transistor T2 and the fourth transistor T4 to be turned off. The second capacitor C2 charges the pull-up node PU by using the high level stored in the input period P1, so that the eleventh transistor T11 remains in the turn-on state. In this case, the high level of the second clock signal terminal CK is transmitted to the signal output terminal Oput via the eleventh transistor T11, and the fifth transistor T5 is controlled to be turned on. The low level of the third voltage terminal V3 is transmitted to the pull-down node PD via the fifth transistor T5, and the low level of the pull-down node PD controls the ninth transistor T9 and the tenth transistor T10 to be turned off.

In addition, under the bootstrapping action of the second capacitor C2, the potential on the pull-up node PU is further increased to maintain the eleventh transistor T11 in the turn-on state, so that the high level of the second clock signal terminal CK may be output as the gate scanning signal to a gate line coupled to the signal output terminal Oput.

Moreover, the sixth transistor T6 is turned on under the control of a high level output from the second voltage terminal V2, and a low level is input via the first clock signal terminal CKB to control the third transistor T3 to be turned off.

A low level is input via the third signal terminal S3 to control the twelfth transistor T12 to be turned off, and a low level is input via the fourth signal terminal S4 to control the thirteenth transistor T13, the fourteenth transistor T14 and the fifteenth transistor T15 to be turned off.

In the pull-down period P3:

In S30, the pull-up control sub-circuit 20 is controlled to be in the turn-off state under the control of a voltage on the first node A, and the pull-down control sub-circuit 30 transmits the clock signal (the high potential) from the first clock signal terminal CKB to the pull-down node PD under control of the first clock signal terminal CKB.

In the pull-down period P3, the pull-down sub-circuit 60 transmits a voltage input via the third voltage terminal V3 to the second node B under the control of a voltage on the pull-down node PD, and after filtering the noises in the voltage input via the second node B, the filter sub-circuit 40 outputs the voltage to the pull-up node PU, to control the output sub-circuit 70 to be turned off. The pull-down sub-circuit 60 also outputs the voltage input via the third voltage terminal V3 to the signal output terminal Oput.

Moreover, the output sub-circuit 70, the initialization sub-circuit 80 and the residual charge elimination sub-circuit 90 are all turned off.

In some embodiments, the structures of the sub-circuits in the above shift register are as shown in FIG. 5, and the transistors in the sub-circuits are the N-type transistors. In the pull-down period P3, a low level is input via the first signal terminal S1, a low level is input via the second clock signal terminal CK, a high level is input via the first clock signal terminal CKB, a low level is input via the third signal terminal S3, a low level is input via the fourth signal terminal S4, a high level is input via the first voltage terminal V1, a high level is input via the second voltage terminal V2, a low level is input via the third voltage terminal V3, a low level is input via the fourth voltage terminal V4, the pull-up node PU is at a low level, the pull-down node PD is at a high level, and a low level is output from the signal output terminal Oput.

In this case, since a high level is input via the first voltage terminal V1, the first transistor T1 is turned on, thereby transmitting the low level of the first signal terminal S1 to the first node A to control the second transistor T2 and the fourth transistor T4 to be turned off. The seventh transistor T7 and the sixth transistor T6 are turned on under the control of a high level output from the second voltage terminal V2, and the high level output from the first clock signal terminal CKB controls the third transistor T3 to be turned on, to transmit the high level output from the first clock signal terminal CKB to the pull-down node PD. The pull-down node PD controls both the ninth transistor T9 and the tenth transistor T10 to be turned on, and the potential on the second node B is pulled down to the low level of the third voltage terminal V3 via the ninth transistor T9. The low level of the second node B is filtered by the seventh transistor T7 filter noises and then transmitted to the pull-up node PU. That is, the potential on the pull-up node PU is pulled down to the low level of the third voltage terminal V3, to control the eleventh transistor T11 to be turned off. A potential on the signal output terminal Oput is pulled down to the low level of the third voltage terminal V3 via the tenth transistor T10, and the fifth transistor T5 is controlled to be turned off. The first capacitor C1 stores a high level of the pull-down node PD, so that the pull-down node PD is maintained at a high level for a long time.

In addition, a low level is input via the third signal terminal S3 to control the twelfth transistor T12 to be turned off, and a low level is input via the fourth signal terminal S4 to control the thirteenth transistor T13, the fourteenth transistor T14 and the fifteenth transistor T15 to be turned off.

Figure 13:
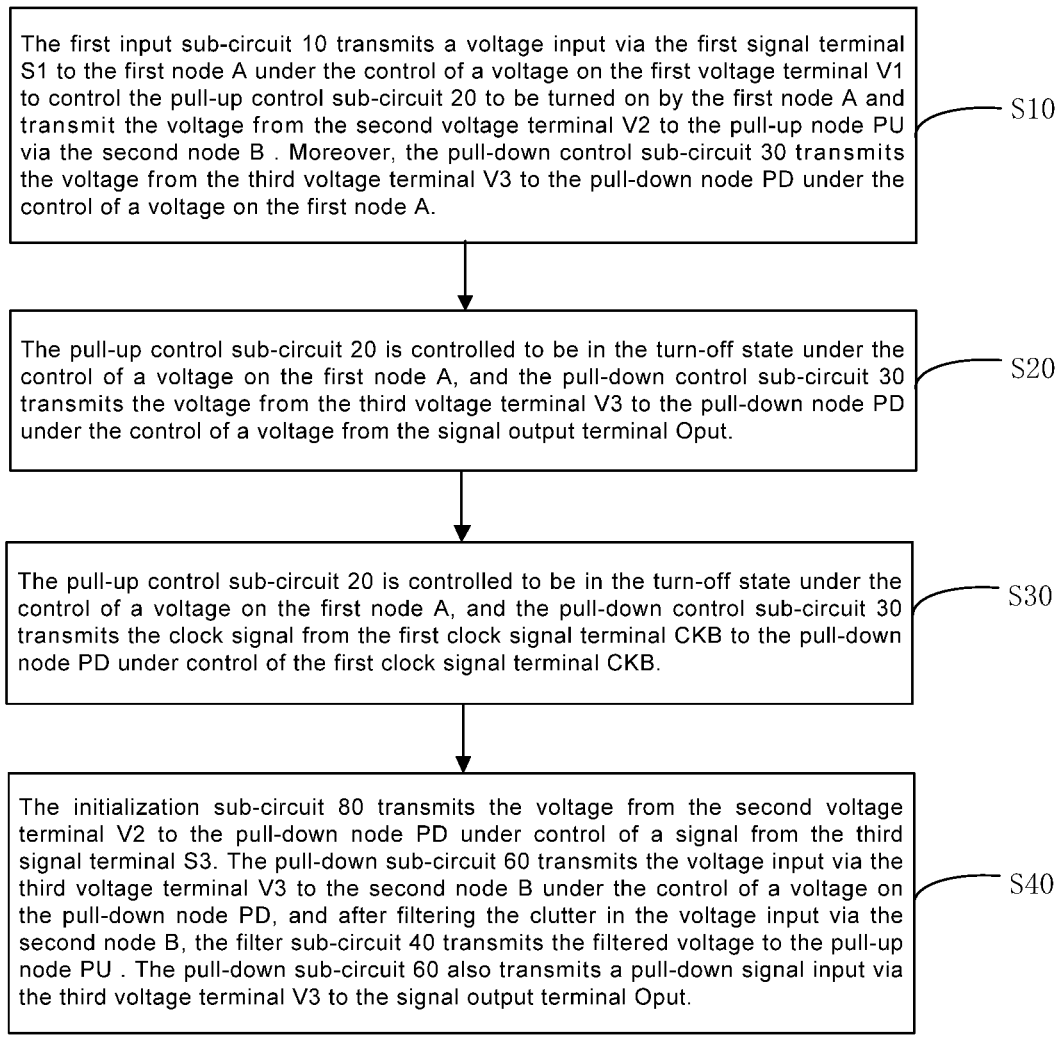
FIG. 13 is a flow diagram of a another method for driving a shift register, in accordance with some embodiments of the present disclosure.

In a case where the shift register includes the initialization sub-circuit 80 and the residual charge elimination sub-circuit 90, at a beginning or an end of an image frame, as shown in FIG. 13, the driving method of the shift register further includes a step 40 (S40).

In the initialization period:

In S40, the initialization sub-circuit 80 transmits the voltage of the second voltage terminal V2 to the pull-down node PD under control of a signal from the third signal terminal S3. The pull-down sub-circuit 60 transmits the voltage input via the third voltage terminal V3 to the second node B under the control of a voltage on the pull-down node PD, and after filtering the noises in the voltage from the second node B, the filter sub-circuit 40 transmits the voltage to the pull-up node PU. The pull-down sub-circuit 60 also outputs a pull-down signal input via the third voltage terminal V3 to the signal output terminal Oput.

In the initialization period, the initialization sub-circuit 80, the pull-down sub-circuit 60 and the filter sub-circuit 40 are turned on.

In some embodiments, the structures of the sub-circuits in the above shift register are as shown in FIG. 5, and the transistors in the sub-circuits are the N-type transistors. In the initialization period, a low level is input via the first signal terminal S1, a low level is input via the second clock signal terminal CK, a low level is input via the first clock signal terminal CKB, a high level is input via the third signal terminal S3, a low level is input via the fourth signal terminal S4, a high level is input via the first voltage terminal V1, a high level is input via the second voltage terminal V2, a low level is input via the third voltage terminal V3, a low level is input via the fourth voltage terminal V4, the pull-up node PU is at a low level, the pull-down node PD is at a high level, and a low level is output from the signal output terminal Oput.

In this case, a high level is output from the third signal terminal S3 to control the twelfth transistor T12 to be turned on, to transmit the high level of the second voltage terminal V2 to the pull-down node PD, and the pull-down node PD controls the ninth transistor T9 and the tenth transistor T10 to be turned on. The ninth transistor T9 transmits the low level of the third voltage terminal V3 to the pull-up node PU, the tenth transistor T10 transmits the low level of the third voltage terminal V3 to the signal output terminal Oput, to pull down both the voltage on the pull-up node PU and the voltage on the signal output terminal Oput to complete the initialization of the shift register.

Figure 14:
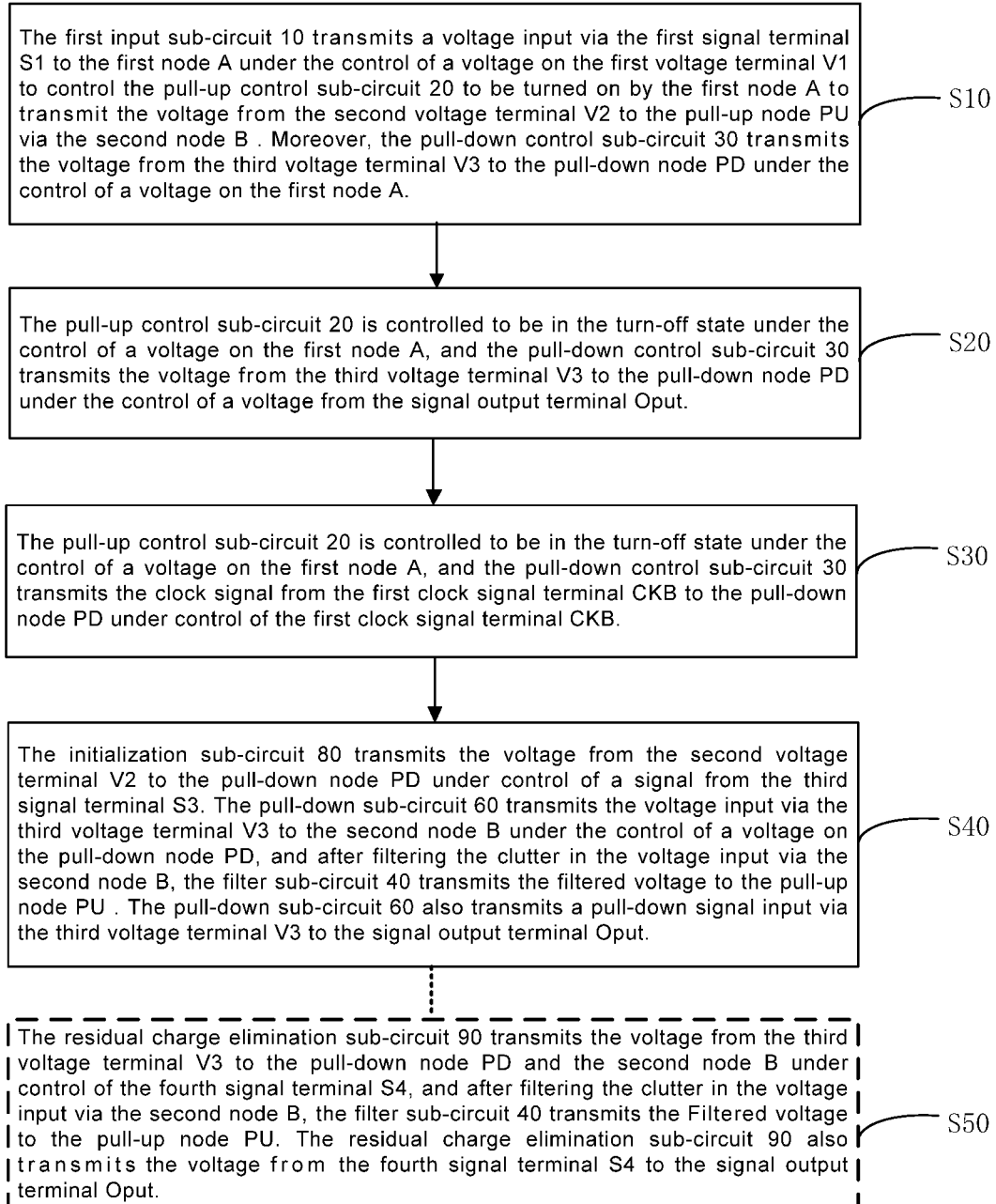
FIG. 14 is a flow diagram of a yet another method for driving a shift register, in accordance with some embodiments of the present disclosure.

In the case where the shift register includes the residual charge elimination sub-circuit 90, each time the gate driving circuit is turned off, as shown in FIG. 14, the driving method of the shift register further includes a step 50 (S50).

In the residual charge elimination period:

In S50, the residual charge elimination sub-circuit 90 transmits the voltage of the third voltage terminal V3 to the pull-down node PD and the second node B under control of the fourth signal terminal S4, and after filtering the noises in the voltage from the second node B, the filter sub-circuit 40 transmits the voltage to the pull-up node PU. The residual charge elimination sub-circuit 90 also outputs the voltage of the fourth signal terminal S4 to the signal output terminal Oput.

In the residual charge elimination period, the residual charge elimination sub-circuit 90, the pull-down sub-circuit 60 and the filter sub-circuit 40 are turned on.

In some embodiments, the structures of the sub-circuits in the above shift register are as shown in FIG. 5, and the transistors in the sub-circuits are the N-type transistors. In the residual charge elimination period, a low level is input via the first signal terminal S1, a low level is input via the second clock signal terminal CK, a high level is input via the first clock signal terminal CKB, a low level is input via the third signal terminal S3, a high level is input via the fourth signal terminal S4, a high level is input via the first voltage terminal V1, a high level is input via the second voltage terminal V2, a low level is input via the third voltage terminal V3, and a low level is input via the fourth voltage terminal V4.

In this case, a high level is output from the fourth signal terminal S4 to control the thirteenth transistor T13, the fourteenth transistor T14 and the fifteenth transistor T15 to be turned on. The fourteenth transistor T14 is turned on to transmit the high level of the fourth signal terminal S4 to the signal output terminal Oput. The fifteenth transistor T15 is turned on to transmit the low level output from the third voltage terminal V3 to the pull-up node PU. The thirteenth transistor T13 is turned on to transmit the low level output from the third voltage terminal V3 to the pull-down node PD, and the pull-down node PD controls the ninth transistor T9 and the tenth transistor T10 to be turned off.

The above is described by taking an example in which the first input sub-circuit 10 is turned on and the gate driving circuit performs the forward scan. In this case, even if the shift register includes the second input sub-circuit 50, the second input sub-circuit 50 remains in the turn-off state in a case where the first input sub-circuit 10 is turned on.

In a case where the shift register includes the second input sub-circuit 50, in order to achieve the reverse scan of the gate driving circuit, the first input sub-circuit 10 is turned off, and the second input sub-circuit 50 is turned on. That is, a high level is input via the fourth voltage terminal V4, a low level is input via the first voltage terminal V1, and other signals remain unchanged.

Relative to the forward scan, a difference between the reverse scan and the forward scan is that, in the input period P1, the second input sub-circuit 50 transmits a voltage input via the second signal terminal S2 to the first node A under the control of a voltage from the fourth voltage terminal V4 to control the pull-up control sub-circuit 20 to be turned on by using the voltage on the first node A so as to transmit the voltage of the second voltage terminal V2 to the pull-up node PU via the second node B. Moreover, the pull-down control sub-circuit 30 transmits the voltage of the third voltage terminal V3 to the pull-down node PD under the control of a voltage on the first node A.

Driving processes in other periods are consistent with the driving process in the periods described above. For details, reference may be made to the foregoing description, and details are not described here again. With regard to the turn-ons and turn-offs of the transistors in each period, a difference only lies in that the eighth transistor T8 instead of the first transistor T1 is turned on, and the turn-ons and turn-offs of remaining transistors in each period are consistent with the above, which are not described here again.

It will be noted that, in a case where the shift register is applied to the gate driving circuit, each image frame includes the input period P1, the output period P2 and the pull-down period P3. The initialization period is generally performed at the beginning or end of each image frame. The residual charge elimination period is performed each time the gate driving circuit is turned off.

Beneficial effects of the driving method of the shift register provided by some embodiments of the present disclosure are the same as the beneficial effects of the above shift register, which are not described herein again.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims

What is claimed is:

1. A shift register, comprising a first input sub-circuit, a pull-up control sub-circuit, a pull-down control sub-circuit, a pull-down sub-circuit, an output sub-circuit, and at least one of a filter sub-circuit or a second input sub-circuit, wherein the first input sub-circuit is coupled to a first signal terminal, a first voltage terminal and a first node, and the first input sub-circuit is configured to transmit a voltage from the first signal terminal to the first node under control of a voltage from the first voltage terminal;

the pull-up control sub-circuit is coupled to the first node, a second voltage terminal and a second node, and the pull-up control sub-circuit is configured to be in a turn-on or turn-off state under control of a voltage on the first node, and transmit a voltage from the second voltage terminal to the second node when the pull-up control sub-circuit is in the turn-on state;

the pull-down control sub-circuit is coupled to the first node, a third voltage terminal, a first clock signal terminal, a signal output terminal and a pull-down node, and the pull-down control sub-circuit is configured to transmit a voltage from the third voltage terminal to the pull-down node under control of a voltage on the first node, transmit the voltage from the third voltage terminal to the pull-down node under control of a voltage from the signal output terminal, and transmit a voltage from the first clock signal terminal to the pull-down node under control of a voltage from the first clock signal terminal;

the pull-down sub-circuit is coupled to the pull-down node, the second node, the signal output terminal and the third voltage terminal, and the pull-down sub-circuit is configured to transmit the voltage from the third voltage terminal to the signal output terminal and the second node that is coupled to a pull-up node under control of a voltage on the pull-down node;

the output sub-circuit is coupled to the pull-up node, a second clock signal terminal and the signal output terminal; and the output sub-circuit is configured to output a voltage from the second clock signal terminal to the signal output terminal under control of a voltage on the pull-up node;

the filter sub-circuit is coupled to the second node, the pull-up node and the second voltage terminal, and the filter sub-circuit is configured, under control of the voltage from the second voltage terminal, to filter noises in the voltage input via the second node to the filter sub-circuit, and transmit the filter voltage to the pull-up node; and the second input sub-circuit is coupled to a second signal terminal, a fourth voltage terminal and the first node, and the second input sub-circuit is configured to transmit a voltage from the second signal terminal to the first node under control of a voltage from the fourth voltage terminal.

2. The shift register according to claim 1, further comprising at least one of an initialization sub-circuit or a residual charge elimination sub-circuit, wherein the initialization sub-circuit is coupled to a third signal terminal, the second voltage terminal and the pull-down node, and the initialization sub-circuit is configured to transmit the voltage from the second voltage terminal to the pull-down node under control of a voltage from the third signal terminal; and the residual charge elimination sub-circuit is coupled to a fourth signal terminal, the third voltage terminal, the second node, the pull-down node and the signal output terminal, and the residual charge elimination sub-circuit is configured to transmit the voltage from the third voltage terminal to the second node and the pull-down node under control of a voltage from the fourth signal terminal; and the residual charge elimination sub-circuit is further configured to transmit the voltage from the fourth signal terminal to the signal output terminal under control of the voltage from the fourth signal terminal.

3. The shift register according to claim 1, wherein the first input sub-circuit includes a first transistor; and a gate of the first transistor is coupled to the first voltage terminal, a first electrode of the first transistor is coupled to the first signal terminal, and a second electrode of the first transistor is coupled to the first node.

4. The shift register according to claim 1, wherein the pull-up control sub-circuit includes a second transistor; and a gate of the second transistor is coupled to the first node, a first electrode of the second transistor is coupled to the second voltage terminal, and a second electrode of the second transistor is coupled to the second node.

5. The shift register according to claim 1, wherein the pull-down control sub-circuit includes a third transistor, a fourth transistor and a fifth transistor;

a gate of the third transistor is coupled to the first clock signal terminal, a first electrode of the third transistor is coupled to the first clock signal terminal, and a second electrode of the third transistor is coupled to the pull-down node; and a gate of the fourth transistor is coupled to the first node, a first electrode of the fourth transistor is coupled to the pull-down node, and a second electrode of the fourth transistor is coupled to the third voltage terminal; and a gate of the fifth transistor is coupled to the signal output terminal, a first electrode of the fifth transistor is coupled to the pull-down node, and a second electrode of the fifth transistor is coupled to the third voltage terminal.

6. The shift register according to claim 5, wherein the pull-down control sub-circuit further includes a sixth transistor; and a gate of the sixth transistor is coupled to the second voltage terminal, a first electrode of the sixth transistor is coupled to the first clock signal terminal, and a second electrode of the sixth transistor is coupled to the gate of the third transistor.

7. The shift register according to claim 5, wherein the pull-down control sub-circuit further includes a first capacitor; and a first electrode of the first capacitor is coupled to the pull-down node, and a second electrode of the first capacitor is coupled to the third voltage terminal.

8. The shift register according to claim 1, wherein in a case where the shift register comprises the filter sub-circuit, the filter sub-circuit includes a seventh transistor; and a gate of the seventh transistor is coupled to the second voltage terminal, a first electrode of the seventh transistor is coupled to the second node, and a second electrode of the seventh transistor is coupled to the pull-up node.

9. The shift register according to claim 1, wherein in a case where the shift register comprises the second input sub-circuit, the second input sub-circuit includes an eighth transistor; and a gate of the eighth transistor is coupled to the fourth voltage terminal, a first electrode of the eighth transistor is coupled to the first node, and a second electrode of the eighth transistor is coupled to the second signal terminal.

10. The shift register according to claim 1, wherein the pull-down sub-circuit includes a ninth transistor and a tenth transistor, and the output sub-circuit includes an eleventh transistor and a second capacitor;

a gate of the ninth transistor is coupled to the pull-down node, a first electrode of the ninth transistor is coupled to the second node, and a second electrode of the ninth transistor is coupled to the third voltage terminal;

a gate of the tenth transistor is coupled to the pull-down node, a first electrode of the tenth transistor is coupled to the signal output terminal, and a second electrode of the tenth transistor is coupled to the third voltage terminal;

a first electrode of the second capacitor is coupled to the pull-up node, and a second electrode of the second capacitor is coupled to the signal output terminal; and a gate of the eleventh transistor is coupled to the pull-up node, a first electrode of the eleventh transistor is coupled to the second clock signal terminal, and a second electrode of the eleventh transistor is coupled to the signal output terminal.

11. The shift register according to claim 2, wherein in a case where the shift register comprises the initialization sub-circuit, the initialization sub-circuit includes a twelfth transistor; and a gate of the twelfth transistor is coupled to the third signal terminal, a first electrode of the twelfth transistor is coupled to the pull-down node, and a second electrode of the twelfth transistor is coupled to the second voltage terminal.

12. The shift register according to claim 2, wherein in a case where the shift register comprises the residual charge elimination sub-circuit, the residual charge elimination sub-circuit includes a thirteenth transistor, a fourteenth transistor and a fifteenth transistor;

a gate of the thirteenth transistor is coupled to the fourth signal terminal, a first electrode of the thirteenth transistor is coupled to the pull-down node, and a second electrode of the thirteenth transistor is coupled to the third voltage terminal;

a gate of the fourteenth transistor is coupled to the fourth signal terminal, a first electrode of the fourteenth transistor is coupled to the signal output terminal, and a second electrode of the fourteenth transistor is coupled to the fourth signal terminal; and a gate of the fifteenth transistor is coupled to the fourth signal terminal, a first electrode of the fifteenth transistor is coupled to the second node, and a second electrode of the fifteenth transistor is coupled to the third voltage terminal.

13. A gate driving circuit, comprising at least two stages of shift registers coupled in cascade according to claim 1, wherein a first signal terminal of a first-stage shift register is coupled to a start signal terminal; and a first signal terminal of each stage of shift register except for the first-stage shift register is coupled to a signal output terminal of a shift register in a previous stage.

14. The gate driving circuit according to claim 13, wherein in a case where each stage of shift register includes a second input sub-circuit, a second signal terminal of each stage of shift register except for a last-stage shift register is coupled to a signal output terminal of a shift register in a next stage; and a second signal terminal of the last-stage shift register is coupled to the start signal terminal or a reset signal terminal.

15. The gate driving circuit according to claim 13, wherein in a case where each stage of shift register includes an output sub-circuit, first clock signal terminal(s) in odd-numbered stage(s) of shift register(s) are coupled to a first clock signal line, and second clock signal terminal(s) in the odd-numbered stage(s) of shift register(s) are coupled to a second clock signal line; and first clock signal terminal(s) in even-numbered stage(s) of shift register(s) are coupled to the second clock signal line, and second clock signal terminal(s) in the even-numbered stage(s) of shift register(s) are coupled to the first clock signal line.

16. A display device, comprising the gate driving circuit according to claim 13.

17. A driving method of the shift register according to claim 1, wherein in a case where the shift register includes a filter sub-circuit, the driving method comprises:

in an input period:

transmitting, by the first input sub-circuit, a voltage from the first signal terminal to a first node under control of a voltage from the first voltage terminal to control the pull-up control sub-circuit to be turned on by using the voltage on the first node to transmit a voltage from the second voltage terminal to the pull-up node via the second node; and transmitting, by the pull-down control sub-circuit, a voltage from the third voltage terminal to the pull-down node under control of the voltage on the first node; and filtering, by the filter sub-circuit, filtering noises in a voltage from the second node, and transmitting, by the filter sub-circuit, the filtered voltage to the pull-up node; and in an output period:

controlling the pull-up control sub-circuit to be in a turn-off state under control of a voltage on the first node; and transmitting, by the pull-down control sub-circuit, the voltage from the third voltage terminal to the pull-down node under control of a voltage from the signal output terminal; and transmitting, by the output sub-circuit, a clock signal from a second clock signal terminal to the signal output terminal under control of a voltage on the pull-up node to output a gate scanning signal via the signal output terminal; and in a pull-down period:

controlling the pull-up control sub-circuit to be in the turn-off state under control of a voltage on the first node; and transmitting, by the pull-down control sub-circuit, a clock signal from the first clock signal terminal to the pull-down node under control of the first clock signal terminal; and transmitting, by the pull-down sub-circuit, the voltage from the third voltage terminal to the second node under control of a voltage on the pull-down node; and outputting, by the pull-down sub-circuit, the voltage from the third voltage terminal to the signal output terminal under control of the voltage on the pull-down node; and transmitting, by the pull-down sub-circuit, the voltage from the third voltage terminal to the second node under control of a voltage on the pull-down node; filtering, by the filter sub-circuit, noises in the voltage from the second node, and transmitting, by the filter sub-circuit, the filtered voltage to the pull-up node to control the output sub-circuit to be turned off; and outputting, by the pull-down sub-circuit, the voltage from the third voltage terminal to the signal output terminal under control of the voltage on the pull-down node.

18. The driving method according to claim 17, wherein in a case where the shift register includes an initialization sub-circuit and a residual charge elimination sub-circuit, the method further comprises:

in an initialization period:

transmitting, by the initialization sub-circuit, the voltage from the second voltage terminal to the pull-down node under control of a signal from a third signal terminal; and transmitting, by the pull-down sub-circuit, the voltage from the third voltage terminal to the second node under control of a voltage on the pull-down node; filtering, by the filter sub-circuit, noises in the voltage from the second node, and transmitting, by the filter sub-circuit, the filtered voltage to the pull-up node; and outputting, by the pull-down sub-circuit, the voltage from the third voltage terminal to the signal output terminal under control of the voltage on the pull-down node; and in a residual charge elimination period:

transmitting, by the residual charge elimination sub-circuit, the voltage from the third voltage terminal to the pull-down node and the second node under control of a signal from a fourth signal terminal; filtering, by the filter sub-circuit, noises in the voltage from the second node, and transmitting, by the filter sub-circuit, the filtered voltage, to the pull-up node; and outputting, by the residual charge elimination sub-circuit, a voltage from the fourth signal terminal to the signal output terminal under control of the signal from a fourth signal terminal.

* * * * *